(12) United States Patent
Lu

(10) Patent No.: US 6,280,887 B1
(45) Date of Patent: Aug. 28, 2001

(54) COMPLEMENTARY AND EXCHANGE MASK DESIGN METHODOLOGY FOR OPTICAL PROXIMITY CORRECTION IN MICROLITHOGRAPHY

(75) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/518,069

(22) Filed: Mar. 2, 2000

(51) Int. Cl.[7] .................. G03F 9/00; G06F 17/50
(52) U.S. Cl. ........................... 430/5; 716/21
(58) Field of Search ............ 430/5, 30; 716/19, 716/21; 250/492.22

(56) References Cited

U.S. PATENT DOCUMENTS 6,127,071 * 10/2000 Lu ............................................. 430/5
6,214,494 * 4/2001 Bula et al. ............................. 430/5

* cited by examiner

Primary Examiner—S. Rosasco
(74) Attorney, Agent, or Firm—McGinn & Gibb, PLLC; Richard M. Kotulak, Esq.

(57) ABSTRACT

A method and structure for performing optical proximity correction in a photolithographic mask to prevent rounding of corners and line end foreshortening of a shape on the photolithographic mask comprises changing a transparency of the photolithographic mask by adding serifs and holes along each edge of the shape intersecting a corner of the shape to establish complementary symmetry along each edge of the shape, changing a transparency of quadrants around each corner of the shape to form mirror image diagonal quadrants centered on corners of the shape, reducing the size of serifs and holes by cutting out unnecessary parts to make the serifs and holes less likely to be printed and exchanging part of the serifs and holes around a corner to make the serifs and holes not printable.

24 Claims, 20 Drawing Sheets

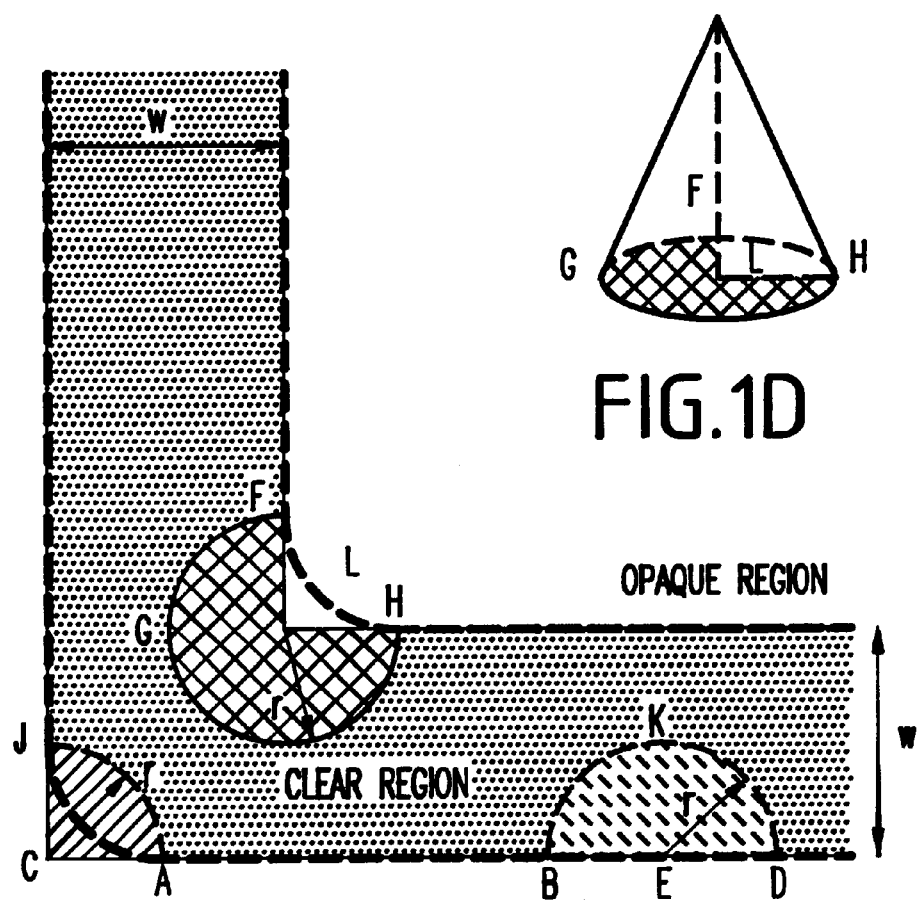
FIG.1D
FIG.1A
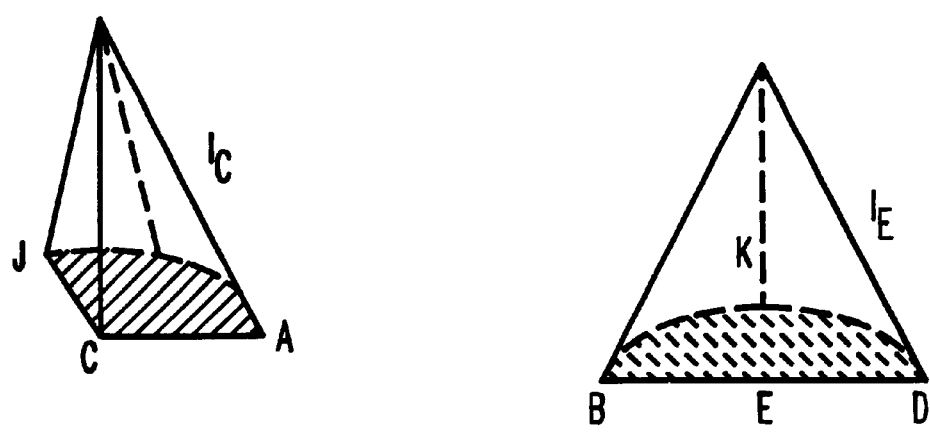
FIG.1C
FIG.1B

COMPLEMENTARY AND EXCHANGE MASK DESIGN METHODOLOGY FOR OPTICAL PROXIMITY CORRECTION IN MICROLITHOGRAPHY

BACKGROUND OF THE INVENTION

1. Field of the Invention

The invention relates generally to the field of photolithography and more particularly to an improved method and system of optical proximity correction in photolithography design using a complementary mask and exchange design methodology.

2. Description of the Related Art

Microlithography is the technology of reproducing patterns using light. As presently used in semiconductor industry, a photomask pattern for a desired circuit is transferred to a wafer through light exposure, development, etch, and resist strip, etc. As feature sizes on a circuit become smaller and smaller, the circuit shape on the wafer differs from the original mask pattern more and more. In particular, corner rounding, line end foreshortening, iso-dense print bias, etc. are typically observed. These phenomena are called optical proximity effects.

One of main reasons for optical proximity effects is light diffraction. Optical proximity effects coming from light diffraction can be overcome partly if one has the choice of using a shorter wavelength source of light, with a projection system possessing a larger numerical aperture. In practice, the wavelength of an optical light source is typically fixed (365 nm for i line, 248 nm and 193 nm for DUV, etc.) and there is a practical upper limit on numerical aperture. So other resolution enhancement methods, including the use of phase-shifting masks and masks with serifs, have been developed to correct optical proximity effects.

Figure 1A shows an elbow shaped mask (the right-angled gray image), and corresponding aerial image after light exposure (or the final photoresist pattern after further development, etch, and resist strip, etc.) as the dashed lines. Similarly, FIG. 1E shows a 45-degree-turn mask (the 45 degree angled gray image), and corresponding aerial image after light exposure (or the final photoresist pattern after further development, etch, and resist strip, etc.) as the dashed lines. Corner rounding appears at both inner corner L and outer corner C as shown by the difference between the straight solid lines and the rounded dashed lines.

The following explanation presents a simple geometric picture for understanding the corner rounding shown in FIGS. 1A and 1E. For definiteness, it is assumed in the following discussion that the clear region of a mask is inside the mask and serif boundaries. Figures 1B–1D relate to aspects of FIG. 1A and FIGS. 1F–1H relate to aspects of FIG. 1E.

For incoherent light illumination (using either circular or rectangular aperture), the aerial image intensity at a point is given by the convolution between the intensity kernel function and the transmitted light intensity around the point, and is proportional to the volume of a truncated cone-type 3D structure. As shown in FIGS. 1B–1D and 1F–1H, the whole cone-type structure represents the intensity kernel function on a 2D region and is centered at that point and has a horizontal range r. The variable r is the resolution limit of the light source used in lithography. The truncation is done according to the actual light transmission around that point, which may be blocked by any opaque region in the photomask.

For an edge point E, that is shown separately in FIGS. 1B and 1F (when its distance to its nearest corner is larger than r), after truncation, its volume is half of whole volume under the intensity kernel function (i.e., half of whole volume of 3D cone-type structure).

For the outer corner C, that is shown separately in FIGS. 1C and 1G, after truncation, its volume is ¼ and ⅜, respectively, of whole volume under the intensity kernel function (denoted "I" herein). Thus, $I_C=I_E/2<I_E$, for FIG. 1C and $I_C=3I_E/4<I_E$ for FIG. 1G, independently of the range r and the form of the intensity kernel function.

The aerial intensity contour line passing through the edge point E will not pass through the outer corner C. Rather, it passes inside the elbow (see the dashed curve in FIGS. 1A and 1E). On the other hand, for the inner corner L, (that is shown separately in FIGS. 1D and 1H) after cut, its volume is ¾ and ⅝, respectively, of whole volume under the intensity kernel function. Consequently, $I_L=3I_E/2>I_E$ for FIG. 1D and $I_L=5I_E/4>I_E$ for FIG. 1H, independently of the range r and the form of the intensity kernel function. The aerial intensity contour line passing through the edge point E will not pass through the inner corner L, but rather passes outside the elbow. This is referred to as corner rounding.

For coherent light illumination (with either circular or rectangular aperture), the aerial image intensity at a point is given by the square of the convolution between the amplitude kernel function and the actual transmitted light amplitude, and is proportional to the square of the volume of a truncated cone-type 3D structure. The whole cone-type structure represents the amplitude kernel function on a 2D region and is centered at that point and has a horizontal range r. The truncation is also done according to the actual light transmission around that point, which may be blocked by any opaque region in the photomask. For an edge point E (when its distance to its nearest corner is larger than r), after truncation, its volume is ½ of whole volume under the amplitude kernel function (i.e., half of whole volume of 3D cone-type structure). For the outer corner C, after cut, its volume is ¼ (for FIG. 1C) or ⅜ (For FIG. 1G) of whole volume under the amplitude kernel function. Thus, $I_C=(½)^2I_E=I_E/4<I_E$ in FIG. 1C and $I_C=(¾)^2I_E=9I_E/16<I_E$ in FIG. 1G, independently of the range r and the form of the amplitude kernel function. The aerial intensity contour curve passing through the edge point E will not pass through the outer corner C. Rather, it passes inside the elbow.

For the inner corner L, after truncation, its volume is ¾ in FIG. 1D and ⅝ in FIG. 1H of whole volume under the amplitude kernel function. Thus, $I_L=(3/2)^2I_E=9I_E/4>I_E$ for FIG. 1D and $I_C=(5/4)^2I_E=25I_E/16>I_E$ for FIG. 1H, independently of the range r and the form of the amplitude kernel function. The aerial intensity contour curve passing through the edge point E will not pass through the inner corner L, but rather passes outside the elbow.

For partially coherent light illumination, the corner rounding can be understood qualitatively: The light contribution to the outer corner C comes from within a ¼ circle region in FIG. 1C and ⅜ circle region in FIG. 1G of radius r (for circular aperture; for square aperture, it is from within a square region of length r), which is less than the contribution to an edge point E coming from within a half circle region of radius r. On the other hand, the light contribution to the inner corner L comes from within ¾ circle region in FIG. 1D and ⅝ circle region in FIG. 1H of radius r, which is more than the contribution to an edge point E coming from within a half circle region of radius r.

SUMMARY OF THE INVENTION

The invention performs optical proximity correction in a photolithographic mask to prevent corner rounding. The goal is to form simply balanced masked shapes near a mask corner or line end by adding serifs and/or subtracting holes. The methods used include a mirroring-and-reverse method and exchange method. More specifically, the method comprises identifying a complementary symmetry line along an edge of a shape within the photolithographic mask, the complementary symmetry line intersecting a corner of the shape, defining a complementary region within the shape adjacent the complementary symmetry line, changing a transparency of the photolithographic mask to form a negative complementary image of the complementary region external to the shape adjacent the complementary symmetry line, identifying quadrants around the corner of the shape, and changing a transparency of the quadrants to form mirror images between diagonal quadrants.

The shape on the mask includes an internal transparent region adjacent the corner having a size r and the complementary region has a width from the complementary symmetry line equal to r. Here r is the effective range of optical proximity effects (e.g., the resolution limit of the light source). In other words, r is an effective range of the kernel function. In general, r is of the order of $k\lambda/NA$, where $\lambda$ is the wavelength of the exposure light, k is about 0.5–0.7, and NA is the numerical aperture. The shape includes an internal transparent region adjacent the corner having a size r and the quadrants comprise r×r squares. The internal transparent region and the external region can be square or circular. Also, the shape can have a 90-degree corner or a 45-degree corner.

The shape is an elbow having an inner corner and an outer corner, the inner corner includes an internal transparent region corresponding to an external non-transparent region adjacent the outer corner. The method further comprises, before identifying the complementary symmetry line, complementarily exchanging a transparency of the internal transparent region and the external region.

The invention also comprises a method of performing optical proximity correction in a photolithographic mask to prevent rounding of corners of a shape on the photolithographic mask that comprise changing a transparency of the photolithographic mask along each edge of the shape intersecting a corner of the shape to establish complementary symmetry along each edge of the shape, and changing a transparency of quadrants around each corner of the shape to form mirror image diagonal quadrants centered on corners of the shape.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1H:
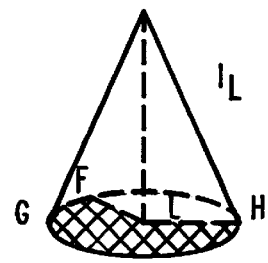
FIG. 1A–1F are schematic architectural diagrams illustrating photo masks overlaid with aerial image/resist pattern having an corner rounding at both inner corner L and outer corner C of 90-degree and 45-degree elbow shape masks.

When it is small, corner rounding for a 90 degree corner turn (e.g., FIG. 1A) at both outer and inner corners can be corrected completely and simultaneously with the use of a hanging serif and a hole. This has been disclosed in co-pending U.S. patent application Ser. No. 09/167,948, and is incorporated fully herein. U.S. patent application Ser. No. 09/167,948 has the same inventor and is commonly assigned with the present application and is therefore not publicly known prior art.

Figure 2A:
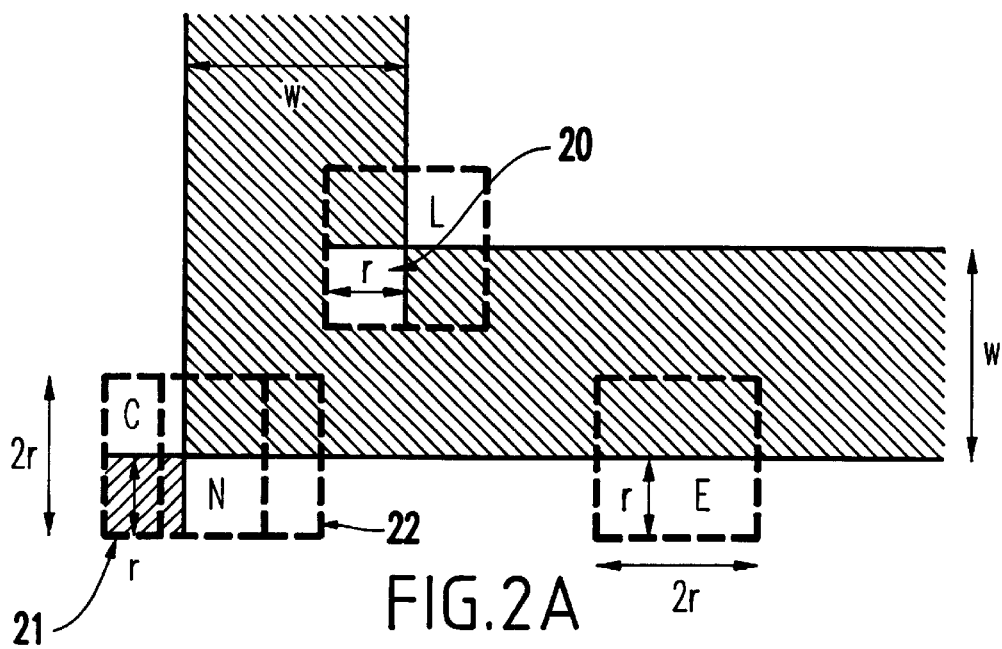
FIG. 2A is a schematic architectural diagram of a mask useful with a square aperture when $r \leq w/2$.
Figure 2B:
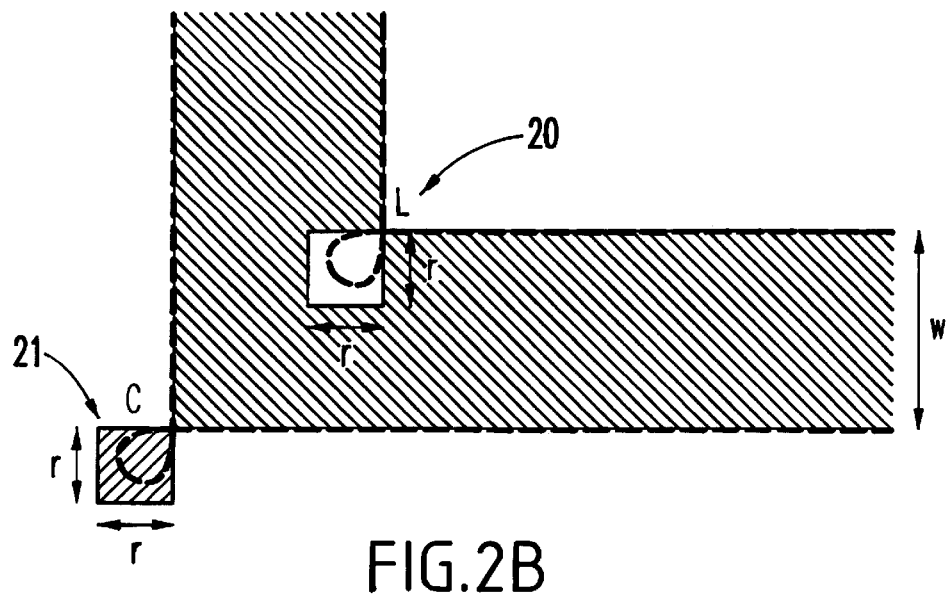
FIG. 2B is a schematic architectural diagram of a mask illustrating a square serif and a square hole.

More specifically, FIGS. 2A and 2B illustrate the serif design for square aperture when the kernel function's range is less than or equal to half of the wire width, $r \leq w/2$ as disclosed in U.S. patent application Ser. No. 09/167,948. FIGS. 2A and 2B show a hanging square serif 21 and a square hole 20 (each is of dimension $r \times r$) for either square or circular aperture. Dashed curves in FIGS. 2B and 3B represent a typical aerial image/resist pattern.

Within dashed-line squares in FIG. 2A, different truncations (e.g., dashed-line square 22) still lead to the same total volume of 3D cone structure and $I_E = I_C = I_L = I_N$ for both incoherent and coherent light illuminations. Thus, a hanging square serif and a square hole (each is of size $r \times r$) work perfectly when $r \leq w/2$ and corner rounding is corrected perfectly. However, both serif 21 and hole 20 features are also printed, as shown in FIG. 2B.

Figure 3A:
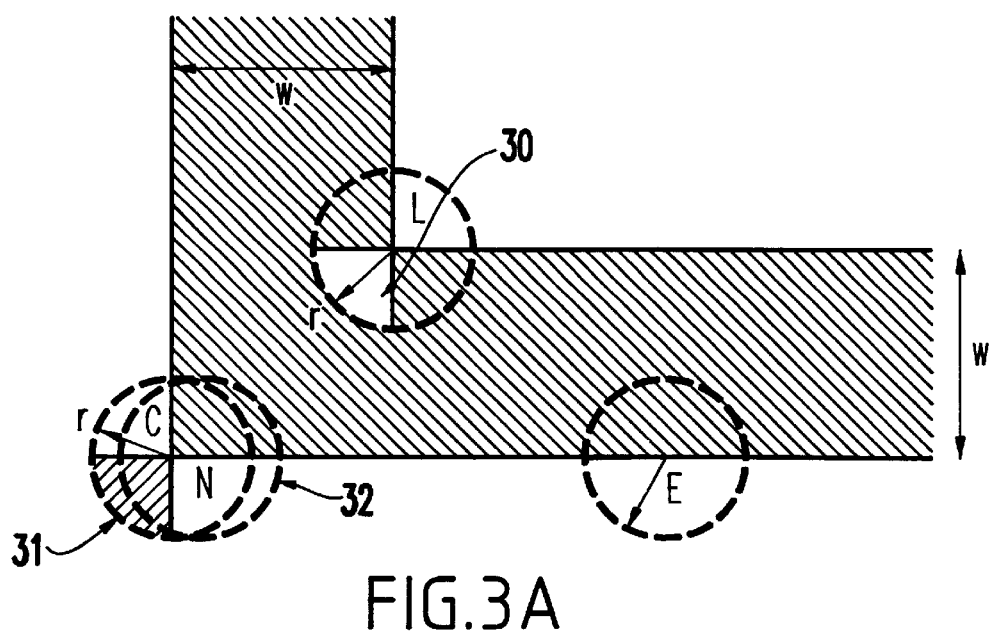
FIG. 3A is a schematic architectural diagram of a mask useful with a circular aperture when $r \leq w/2$.
Figure 3B:
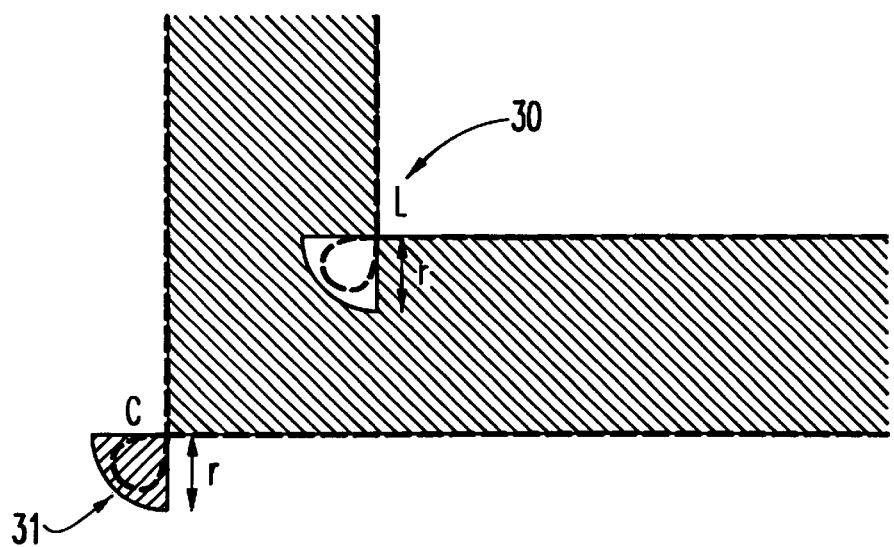
FIG. 3B is a schematic architectural diagram of a mask illustrating a quarter circle serif and a quarter circle hole.

FIGS. 3A and 3B depict the ideal quarter circle serif design for circular aperture when the kernel function's radius is not larger than half the wire width, $r \leq w/2$ as disclosed in U.S. patent application Ser. No. 09/167,948. Within dashed-line full circles in FIG. 3A, different cuts (e.g., dashed-line full circle 32) still give the same total volume of 3D cone structure and $I_E = I_C = I_L = I_N$ for both incoherent and coherent light illuminations. Thus, a hanging quarter-circle serif 31 and a quarter-circle hole 30 (each is of radius r) work perfectly when $r \leq w/2$.

Figure 1E:
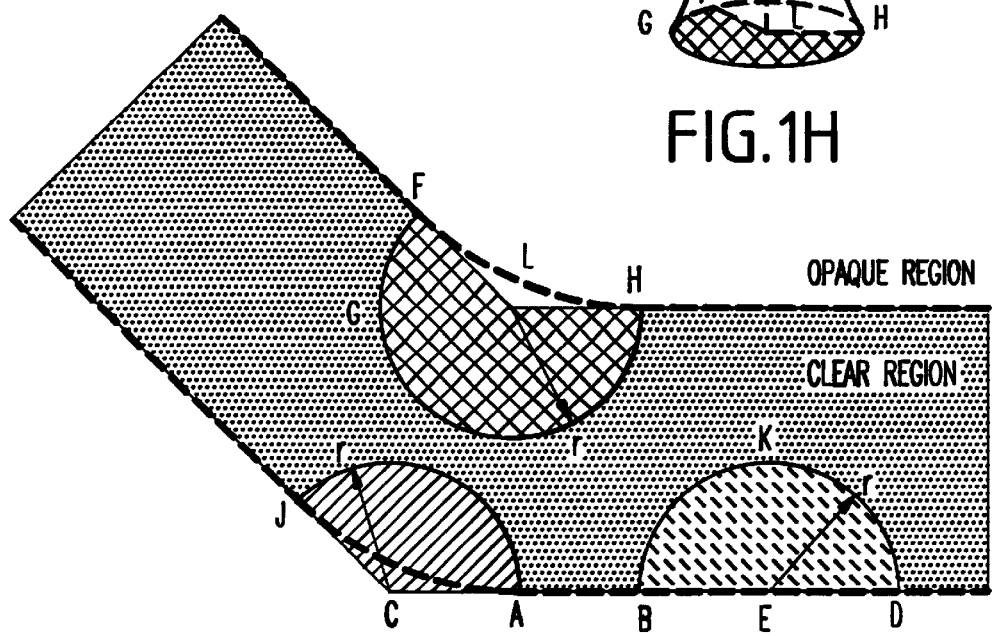
Figure 1G:
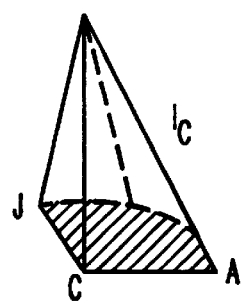
Figure 1F:
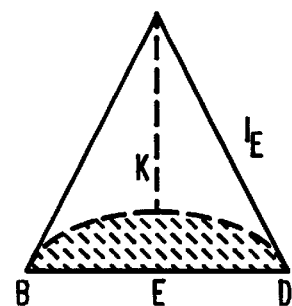

However, when corner rounding is not small (i.e., when $r > w/2$), the masks shown in FIGS. 2 and 3 no longer work satisfactorily. The optical proximity effects become a serious concern when the kernel function's range is larger than half of the wire width. The wire width is a typical feature size. The serif mask designs in FIGS. 2A–3B do not apply for a 45-degree wire line turn (e.g., FIG. 1E), even when $r \leq w/2$. Thus, the optical proximity correction (OPC) for a 45-degree turn still remains a problem.

Figure 4:
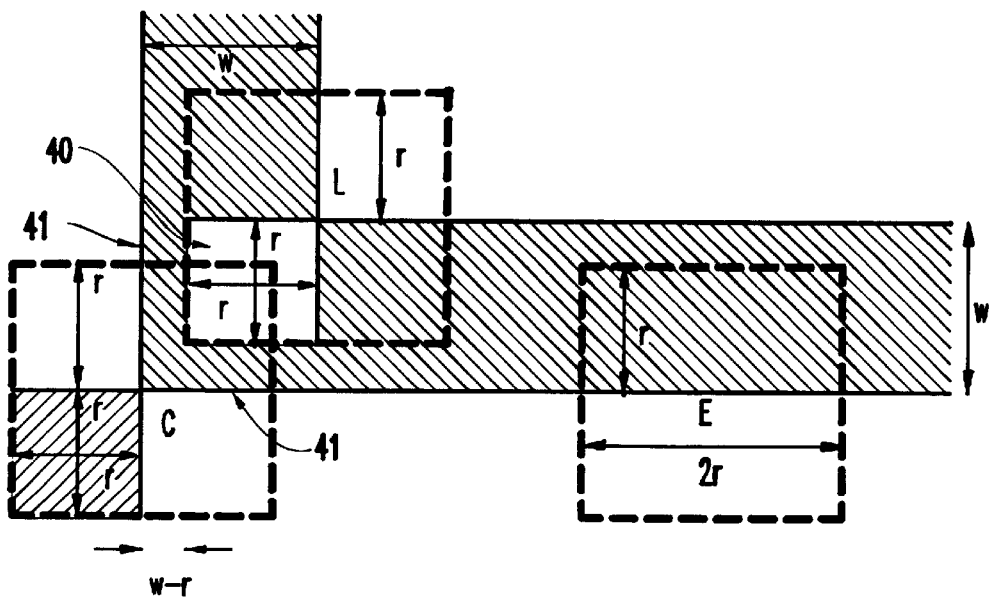
FIG. 4 is a schematic architectural diagram of a mask with a square aperture when $w/2 < r < w$.

FIG. 4 illustrates a square aperture when the kernel function's range becomes larger than half of the wire width, $r > w/2$. The design in FIG. 4 will still guarantee $I_L = I_E$, but it will lead to $I_C \neq I_E$ because the hole 40 removes a large portion of the wire and leaves areas 41 thin. Thus, a hanging square serif and a square hole (each is of size $r \times r$) no longer gives the desired results on aerial image/resist pattern when $r > w/2$.

Figure 5:
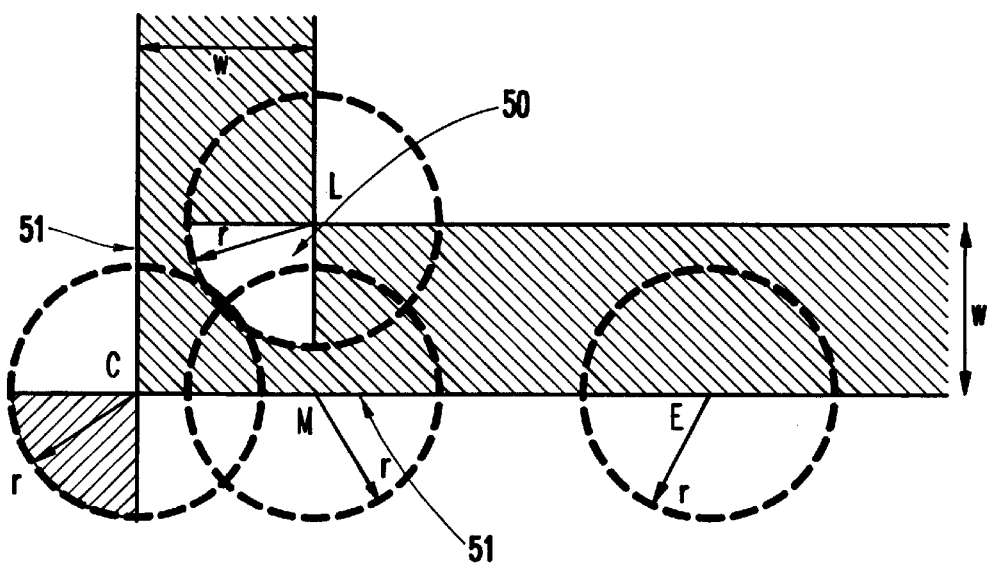
FIG. 5 is a schematic architectural diagram of a mask with a circular aperture when $w/2 < r < w$.

FIG. 5 illustrates circular apertures when the kernel function's radius becomes larger than half of the wire width, $r > w/2$. Here, two dash circles around an edge point E and around the inner corner L contain same total volume of 3D cone structure, and one still has $I_L = I_E$. But the masked areas (or unmasked areas) within the dash circles centered at the outer corner C and at edge points M and E become unequal, and one finds that $I_C \neq I_E$ as well as $I_M \neq I_E$ again because the hole 50 removes a large portion of the wire and leaves areas 51 thin. Consequently, the hanging quarter-circle serif and the quarter-circle hole (each is of radius r) no longer bring us desired results for optical proximity correction (OPC) when $r > w/2$.

When optical proximity effects are severe (i.e., large corner rounding at both outer and inner corners of an elbow shaped mask), it may become impossible to achieve $I_L = I_E$.

(For example, when $r > w$, any hole at inner corner L cannot be larger than the size $r \times r$.) The following addresses how to get the same intensity at the outer corner C and at the edge point E (i.e., $I_C = I_E$) when $r > w$.

Figure 6:
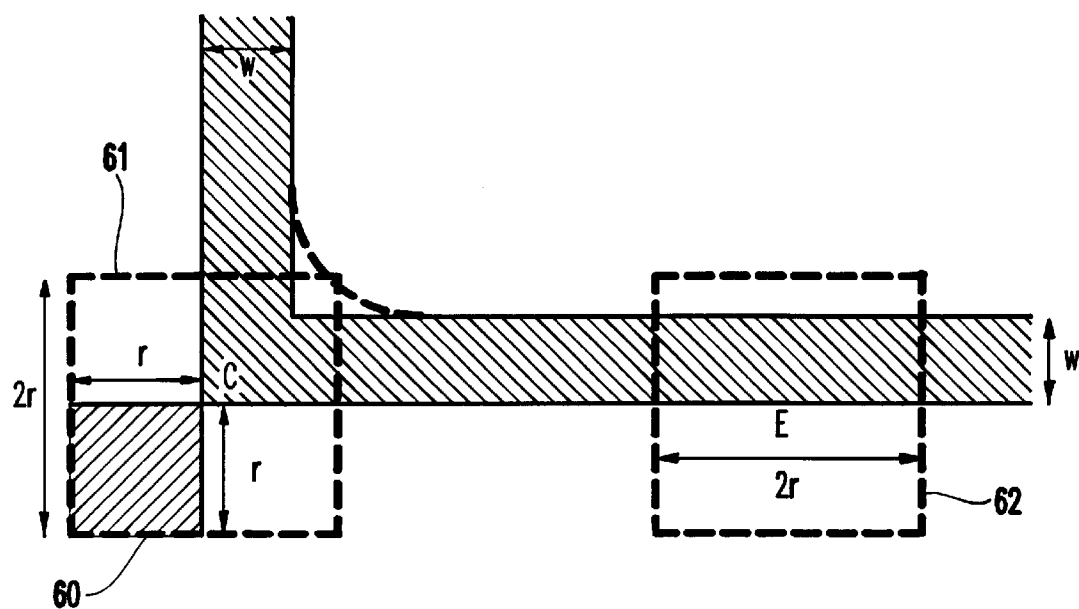
FIG. 6 is a schematic architectural diagram of a mask with a square aperture when $r > w$.

FIG. 6 shows a hanging square serif 60 of size $r \times r$ at the outer corner C. Since $r > w$, the masked (or unmasked) areas within two dashed-line bigger squares 61, 62 are not equal, and this design leads to $I_C \neq I_E$. Thus, OPC at the outer corner C is still an unsolved problem when $r > w$.

Figure 7:
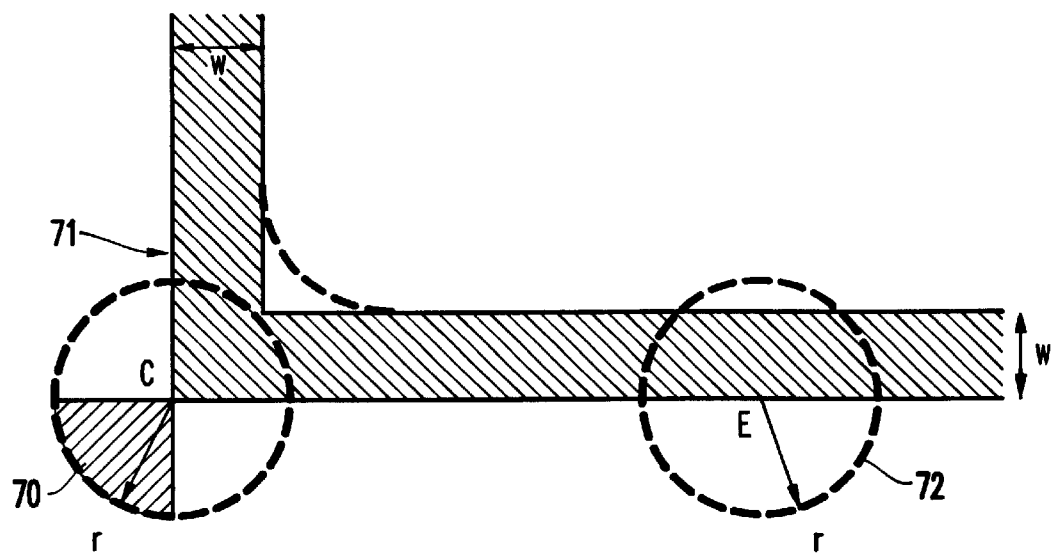
FIG. 7 is a schematic architectural diagram of a mask with a circular aperture when $r > w$.

FIG. 7 illustrates a hanging quarter-circle serif 70 of radius r at the outer corner C. Owing to $r > w$, the masked (or unmasked) areas within two dash circles 71, 72 are not equal, and this design leads to $I_C \neq I_E$. Consequently, OPC at the outer corner C is also a problem when $r > w$.

This disclosure presents a new photomask design methodology—called complementary and exchange mask design methodology—to accomplish OPC in microlithography. The invention uses the elbow shape mask as an example to present this new methodology while showing how to correct medium to severe corner rounding. As will be seen, the new methodology accomplishes the OPC task (e.g., to correct the corner rounding) better. The new method can help to find the limit of OPC and the tradeoff for any optimization work the OPC might evolve.

The invention discussed below discloses how to design serif masks to perfectly correct corner rounding for both 45- and 90-degree corners, without printing serif/hole features. The invention also includes (1) an exchange feature and (2) a set of serif mask design rules—called "mirroring-and-reverse"—for optical proximity correction in photolithography. The following uses the 45-degree turn and the usual 90-degree-angle corner as examples to present these serif mask design rules and corresponding methodology. However, the invention is not limited to these two shapes and, as would be known by one ordinarily skilled in the art given in this disclosure, the invention is applicable to any similar shape.

Specifically, the invention addresses the situation of $r > w/2$, where w is the wire width (typical feature size), and r is the kernel function's effective range. Namely, in a local coordinate system which centers at the point under consideration for calculating its aerial image, the kernel function K is substantially zero when its argument is larger than r: $K(x, y) = 0$ when $x > r$ and/or $y > r$ for square aperture, and $K(\rho) = 0$ when $\rho > r$ for circular aperture. For incoherent light illumination, r can be the range of combined kernel function for both optical imaging process (which leads to aerial image) and subsequent etch and resist development processes (assumed to be a convolution process, e.g., a simple diffusion process), in which case $I_E$, $I_C$, $I_L$, and $I_M$ in the following represent the final resist pattern. For simplicity, it is also assumed that r is less than or equal to the wire width in the following (except for the embodiment discussed below with respect to FIG. 13).

This disclosure first considers the situation involving square aperture. For the square aperture, the following symmetry properties usually exist:

$$K(x, y) = K(|x|, |y|) = K(y, x) \tag{1}$$

The invention corrects corner rounding at both inner and outer corners perfectly and simultaneously using two "complementary design rules":

Complementary design rule 1. An edge line serves as a "complementary symmetry" line. Any part missing on one side of the "complementary region" should be compensated by adding its mirror image on the other side of the complementary region (if possible). Also, any extra part on one side of the "complementary region" should be complemented by taking out its mirror image part on the other side of the complementary region (if possible). Here, a "complementary region" is defined as a strip region of width min (r, w) on one side of the edge line.

Complementary design rule 2. Two perpendicular edge lines meeting at a corner and their extensions divide the region around the corner into 4 quadrants. Each quadrant is of size min (r, w)×min (r, w). Any part missing in one quadrant should be compensated by adding a similar part in one of other quadrants (if possible). Similarly, any extra part in one quadrant should be complemented by cutting out a similar part in one of other quadrants (if possible).

In other words, the first complementary design rule provides that the transparency of the mask along the edge of the shape is changed to establish complementary (e.g., negative image) symmetry for the width r along each edge of the shape. The second complementary design rule provides that the transparency of quadrants around each corner of the shape is changed to form mirror image diagonal quadrants centered on the corners of the shape.

More specifically, with respect to the first complementary design rule, a complementary symmetry line is an edge line of the original design element. A "complementary region" is defined as a strip region of width r within the shape along the edge line. The transparency of portions along the complementary region are complemented by opposite transparency (e.g., negative image) portions on the other side of the complementary symmetry line (e.g., along the area of the mask external to the complementary region).

Therefore, transparent portions along the complementary region are complemented with identical non-transparent portions external to the shape on the other side of the complementary symmetry line and portions along the complementary region are complemented with identical transparent portions external to the shape on the other side of the complementary symmetry line.

Figure 8:
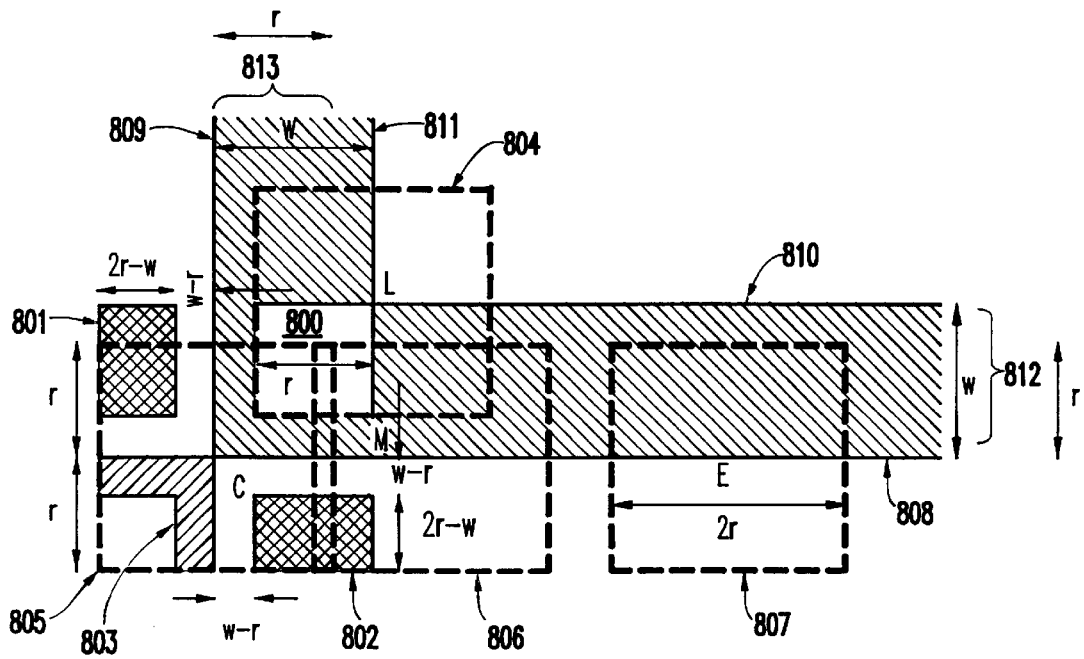
FIG. 8 is a schematic architectural diagram of a mask useful with a square aperture when $w/2 < r < w$.

For example, two complementary symmetry lines which would be selected are shown as items 808 and 809 in FIG. 8. FIG. 8 shows a serif photomask design for the case of w/2<r<w. The invention starts the serif design process by keeping the square hole 800 of size r×r at the inner corner L to make $I_L=I_E$ first. The invention ends the OPC process with 3 serifs 801–803 near the outer corner C. Two of the serifs 801–802 are detached rectangles and one of the serifs 803 has a right-angle-turn shape.

With reference to the lower horizontal complementary symmetry line 808, the complementary region includes a strip of the shape which is the distance r from the complementary symmetry line 808. This strip (e.g., complementary region 812) is bordered by the complementary symmetry line 808 along the lower image and by a line formed by the top of the boxes 805–807.

The first rule requires that a masked (unmasked) region complement any unmasked (masked) region within the complementary region 812. Serif 802 performs this function by providing a complement for a portion of the square 800 that is within the distance r from the complementary symmetry line 808. The width of the serif 802 is equal to r and the height is equal to 2r–w. It is also important to note that the unmasked region between serif 802 and complementary symmetry line 808 is the complement for the portion of the shape between the complementary symmetry line 808 and the square 800. Similarly, the remaining unmasked area adjacent the complementary symmetry line 808 is the complement for the masked portion of the shape that is within the complementary region 812. Similarly, applying the first complementary design rule creates a complementary region (e.g., strip) 813 adjacent to the vertical line 809. Serif 801 is the complement for the portion of the opening 800 which resides within the complementary region 813 adjacent to the complementary symmetry line 809. Note that application of the first complementary design rule to lines 810 and 811 does not produce any complementary serif structures.

The original hanging square serif of size r×r (e.g., item 21 in FIGS. 2A and 2B) at the outer corner C has a small square region of size (2r–w)×(2r×w) removed. This removal is based on the second complementary design rule mentioned above.

With the second complementary design rule, two perpendicular edge lines meeting at a corner and their extensions divide the region around the corner into four equal quadrants. Each quadrant is of size r×r. Any part missing (or extra part) in one quadrant should be compensated by adding (or removing) a similar part in one of other quadrants to create proper mirror images among four quadrants. More specifically, the transparency of the diagonal quadrants adjacent a corner of the shape are changed to balance and mirror all the quadrants adjacent the corner.

The second complementary design rule is applied to FIG. 8 as follows. Box 805 is divided into four quadrants surrounding point C. The lower left quadrant includes a serif 803 which is a mirror image of the masked material within the upper right quadrant of box 805. Similarly, the smaller unmasked square within the lower left quadrant matches the portion of the square 800 which lies within the upper right quadrant of box 805. The upper left quadrant and lower right quadrant are already balanced (as a result of the application of the first complementary design rule) and are not changed by the second complementary design rule.

The masked areas (or unmasked areas) within the four dashed-line bigger squares 804–807 are the same. More importantly, total volumes of 3D cone structures within four dashed-line squares 804–807 are equal, independent of the specific shape of kernel function K(x, y). This provides equal aerial intensity (i.e., $I_C=I_L=I_M=I_E$) for both incoherent and coherent light illuminations, independent of the shape of their kernel function. Notice that the edge point M in FIG. 8 can be anywhere on the outer edges or anywhere on the inner edges.

Figure 9:
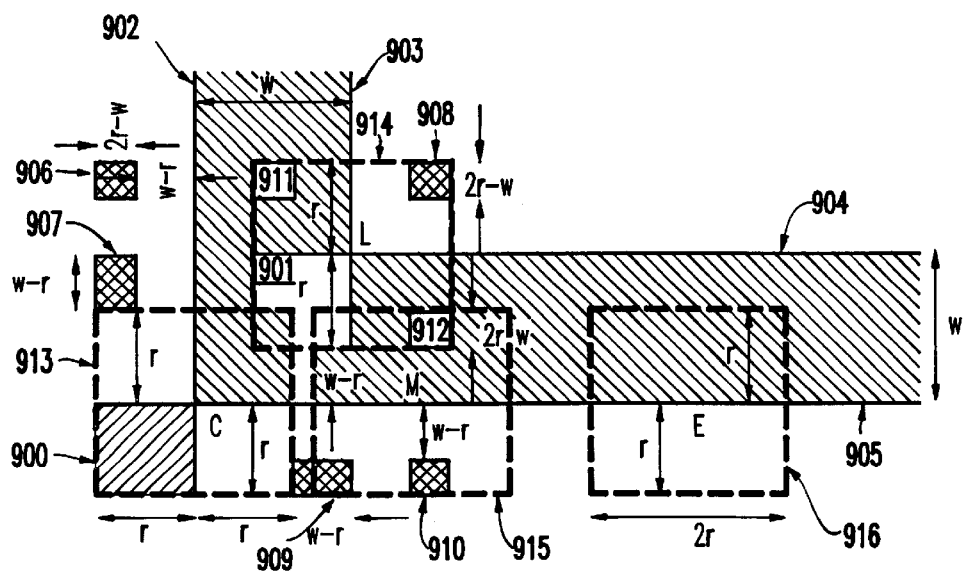
FIG. 9 is a schematic architectural diagram of a mask useful with a square aperture when $w/2 < r < w$.

FIG. 9 illustrates another serif photomask design that is based on the same complementary design rules mentioned above. FIG. 9 illustrates another embodiment of the invention where the serif design process starts by keeping the square serif 900 at the outer corner C to get $I_C=I_E$ first. The first and second complementary design rules are applied to complete the OPC process with 3 holes (including a modification of the square 901) and 5 additional detached rectangular serifs.

More specifically, the first complementary design rule is applied to the shape shown in FIG. 9 to create complimentary regions corresponding to the complementary symmetry lines 902 and 905. The application of the first rule to complementary symmetry line 902 forms serifs 906 and 907, as discussed above. A similar application of the first complementary design rule to complimentary symmetry line 905 produces serifs 909 and 910.

Then, as with FIG. 8, the second complementary design rule forms 4 quadrants within box 913 surrounding point C. This embodiment is different than the previous embodiments in that the upper right quadrant is modified to be a mirror image of the lower left quadrant. Therefore, in this embodiment, the square 901 is modified with the addition of a smaller square of masked material in the lower left corner of square 901 to make the upper right quadrant of box 913 a mirror image of the lower left quadrant. Further, the second complementary design rule is also applied to point L. The smaller masked square added to square 901 requires the addition of serif 908 to provide proper symmetry according to the second complementary design rule.

Finally, with the placement of the serif 908 outside the complementary symmetry lines 903 and 904, the first complementary design rule is applied to complementary symmetry lines 903 and 904 to form additional openings 911 and 912. Therefore, in specific situations, the invention can apply and reapply the first and second complimentary design rules in a continuous repetitive fashion until each of the rules makes no further changes to the shape. In other words, the invention repeats the application of the complementary design rules as the shape of the design changes to ensure that the final design complies with all complementary design rules.

As with the squares in FIG. 8, the masked areas (or unmasked areas) within four dashed-line bigger squares 913–916 in FIG. 9 are the same. Moreover, total volumes of 3D cone structures within four dashed-line squares are equal, independent of the specific shape of kernel function K(x, y). This proves equal aerial intensity (i.e., $I_C=I_L=I_M=I_E$) for both incoherent and coherent light illuminations, independent of the shape of their kernel functions. Note that the edge point M in FIG. 9 can also be anywhere on the outer edges or anywhere on the inner edges. This means complete and simultaneous corner rounding correction at both inner and outer corners.

Figure 10:
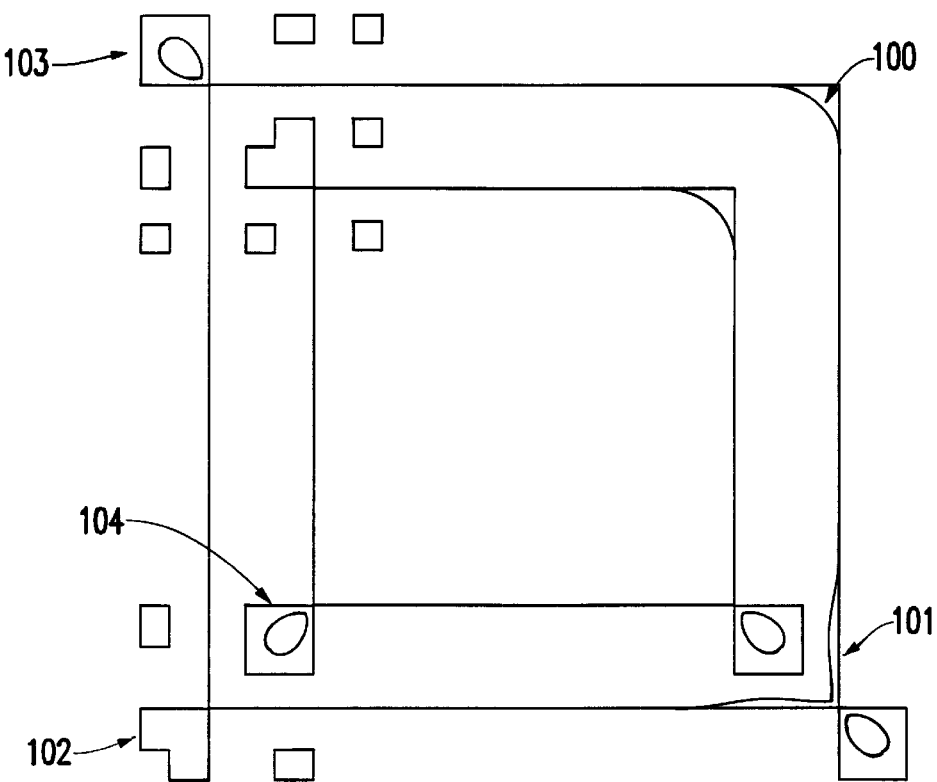
FIG. 10 is a schematic architectural diagram of a mask useful with a square aperture when $w/2 < r < w$ overlaid with an image.

FIG. 10 is typical aerial images/resist patterns for problematic serif design shown in FIG. 4 and the two new designs illustrated in FIGS. 8 and 9. Upper-right part 100 of FIG. 10 shows the corner rounding (in the absence of any serifs). The lower-right part 101 of FIG. 10 corresponds to the situation discussed in FIG. 4; namely, a square serif of size r×r was hanging at the outer corner, and a square hole of the same size was taken from the place near the inner corner. The lower-left part 102 of FIG. 10 corresponds to FIG. 8, and the upper-left part 103 of FIG. 10 is for FIG. 9. Notice that the whole square serif 103 and the whole square hole 104 (each is of size r×r) are somewhat too big and may actually be printed. A compromise is to allow a small amount of corner rounding by reducing the sizes of those printable serifs/holes (and sizes and shapes of other serifs/holes correspondingly). In this way, big serifs and holes are not actually printed, as desired.

The inventive complementary design rules are equally applied to cases involving circular aperture. The kernel function K(r) is assumed to be angle-independent in the case of circular aperture. Each of serif designs presented in FIGS. 8 and 9 still give equal aerial intensity $I_C=I_L=I_M=I_E$ and thus perfect and simultaneous corner rounding correction at both inner and outer corners for circular aperture when w/2<r<w. Under certain situations, the serif's shape can be optimized without changing any intensities $I_C$, $I_L$, and $I_M$ (i.e., this always maintains $I_C=I_L=I_M=I_E$). Another improvement the invention achieves for circular aperture is to reduce the sizes of serifs and holes so that they become less likely to be printable in aerial image/resist pattern.

Figure 11:
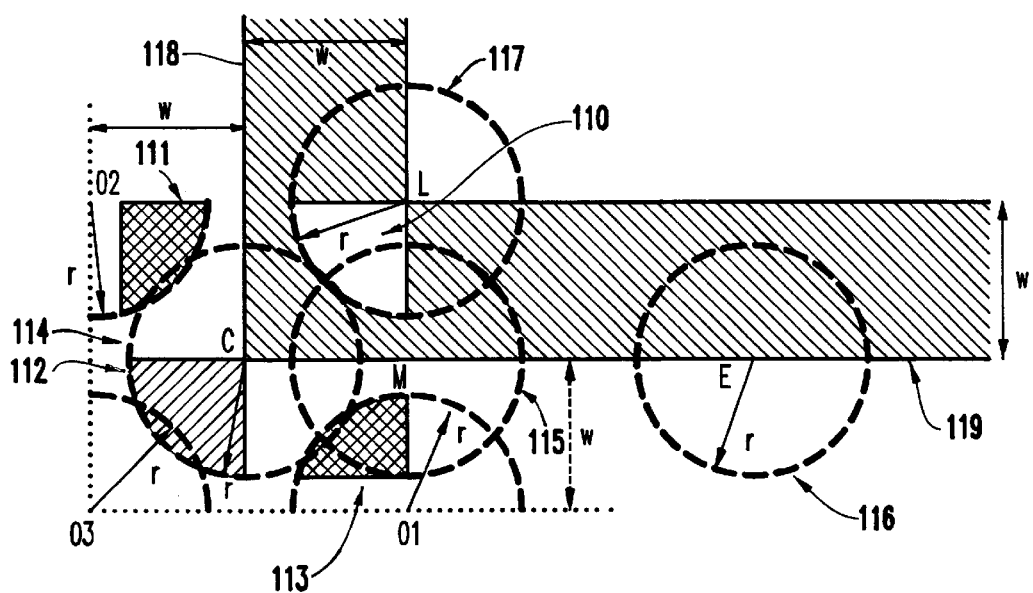
FIG. 11 is a schematic architectural diagram of a mask useful with a circular aperture when $w/2 < r < w$.

Referring now to FIG. 11, an ideal serif photomask design for the case of w/2<r<w is illustrated. Similarly to FIG. 8, the invention starts the serif design process by keeping the quarter-circle hole 110 of radius r at the inner corner L to make $I_L=I_E$ first. Using the above complementary design rules, the design process ends with 3 serifs 111–113 near the outer corner C. More specifically, the first complementary design rule creates complementary regions adjacent complementary symmetry lines 118 and 119, and adds serifs 111 and 113, as discussed above. The second complementary design rule is applied to create quadrants around Point C and add serif 112 to provide symmetry between the lower left quadrant and the upper right quadrant, as discussed above.

As with the previous illustrations, the masked areas (or unmasked areas) within four big circles 114–117 are the same. More importantly, total volumes of 3D cone structures within four big circles are equal, independent of the specific shape of kernel function K(r). This implies equal aerial intensity (i.e., $I_C=I_L=I_M=I_E$) for both incoherent and coherent light illuminations, independent of the shape of their kernel functions. Notice that, again, the edge point M in FIG. 11 can be anywhere on the outer edges or anywhere on the inner edges. Thus, the invention achieves perfect and simultaneous corner rounding correction at both inner and outer corners.

Comparing FIG. 11 with FIG. 8, it can be seen that each of two detached serifs in FIG. 11 is the result of an intersection (a Boolean operation) between the original rectangular serif of size r×(2r−w) (see FIG. 8) with a circle of radius r centered at O1 or O2. Note that circle center O1 (O2) is the mirror image of the inner corner L along the edge line 119 (118). The dashed-line circle of radius r which centers at O3 cuts off a part from the quarter-circle serif centered at the outer corner C if and only if r>w/√2=0.707w.

Figure 12:
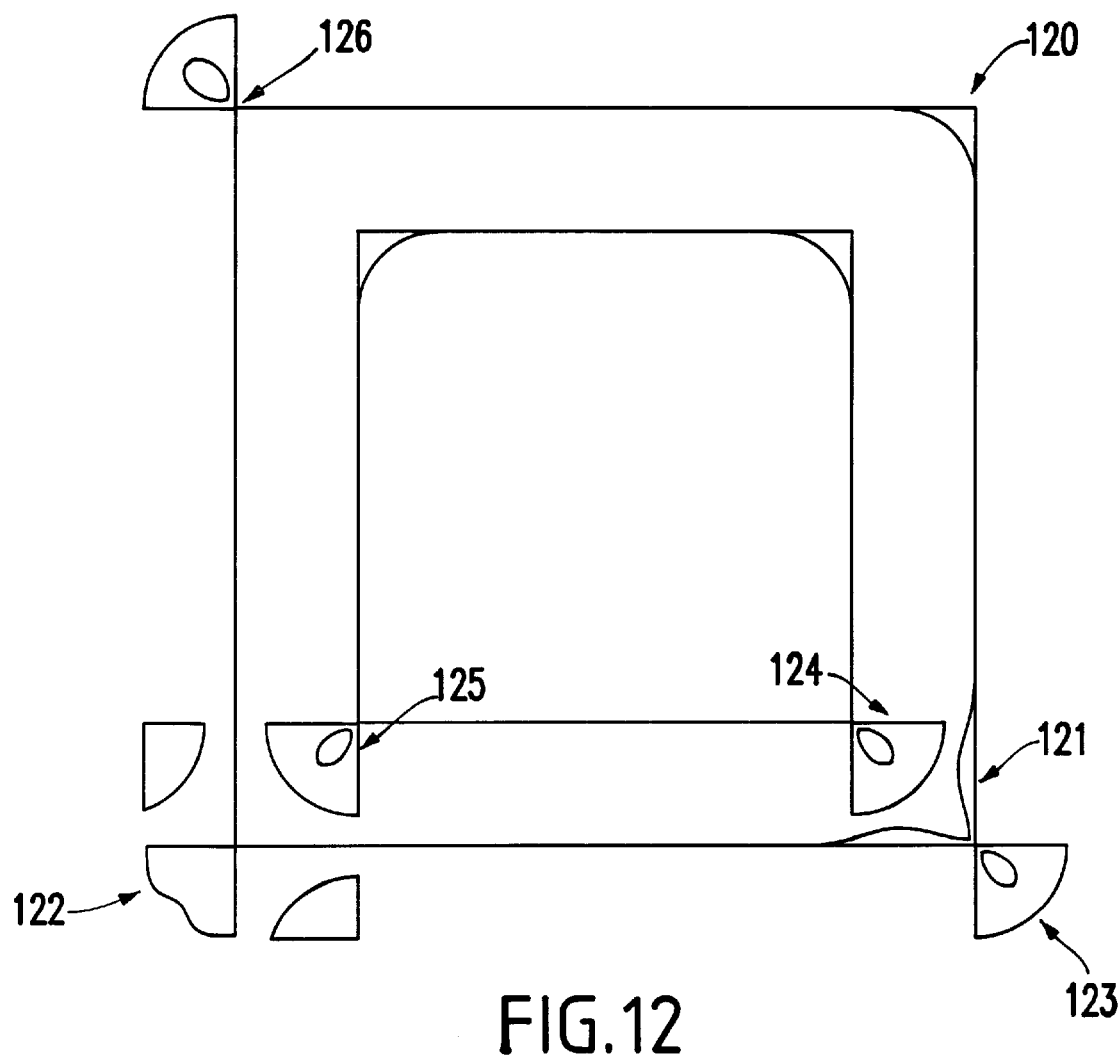
FIG. 12 is a schematic architectural diagram of a mask useful with a circular aperture when $w/2 < r < w$ overlaid with an aerial image/resist pattern.

FIG. 12 is a typical aerial image/resist pattern. The upper-right part 120 of the figure shows the corner rounding in the absence of any serifs. The lower-right part 121 of the figure illustrates the aerial image/resist pattern for original serif mask design shown in FIG. 5; i.e., a quarter-circle serif of radius r was hanging at the outer corner C, and a quarter-circle hole of the same radius was taken from near the inner corner L. The lower-left part 122 of FIG. 12 corresponds to FIG. 11.

Again, complete quarter-circle serifs 123 and 126 and holes 124 and 125 (each is of radius r) are somewhat too big so that themselves are printable. A compromise is to allow a small amount of corner rounding by reducing the radii of those printable serifs/holes (and sizes and shapes of other serifs/holes correspondingly). By so doing, big serifs and holes will become not printable. Notice that quarter-circle serifs and holes as well as their truncated shapes in FIG. 12 are represented by their bitmap representation, which is an approximation to their ideal shapes.

When corner rounding is severe, it is hard to do OPC at both inner and outer corners of an elbow shape mask. In the following examples, the invention seeks to achieve only same intensity at the outer corner C and at the edge point E (i.e., $I_C=I_E$) when r>w.

Figure 13:
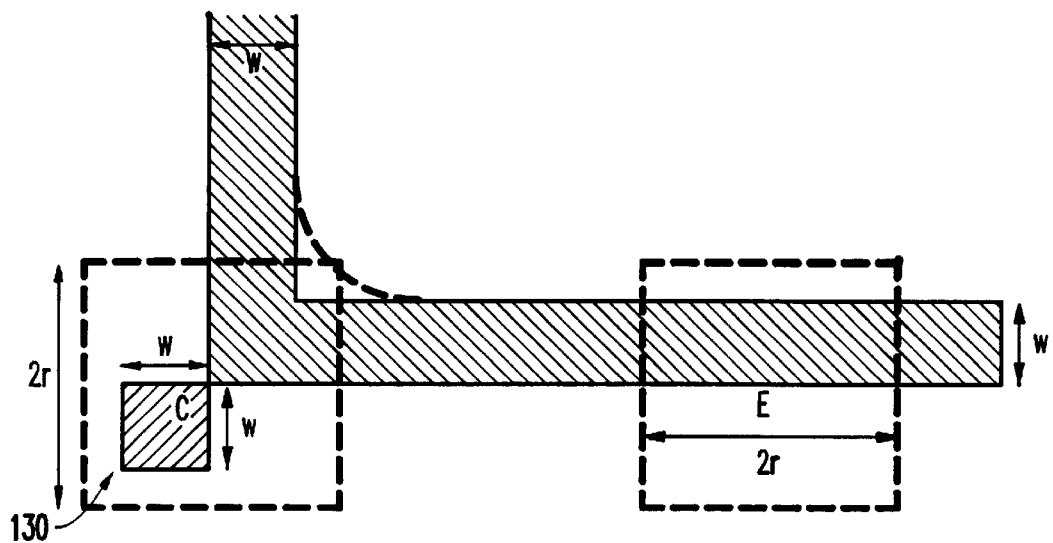
FIG. 13 is a schematic architectural diagram of a mask useful with a square aperture when $r > w$.

FIG. 13 shows the application of the inventive complementary design rules for achieving $I_C=I_E$ when r>w. More specifically, the first complementary design rule would not add any serifs to the structure shown in FIG. 13. However, the second complementary design rule adds serif 130. It is interesting to note when comparing FIG. 13 to the process described above with respect to FIG. 6, that the complementary design rules reduce the size of the hanging square serif from r×r in FIG. 6 to w×w to give equal aerial intensity $I_C=I_E$ for square or circular aperture when r>w. Further, this embodiment reduces the serif's area so that serif itself becomes less likely to be printable in aerial image/resist pattern.

Figure 14:
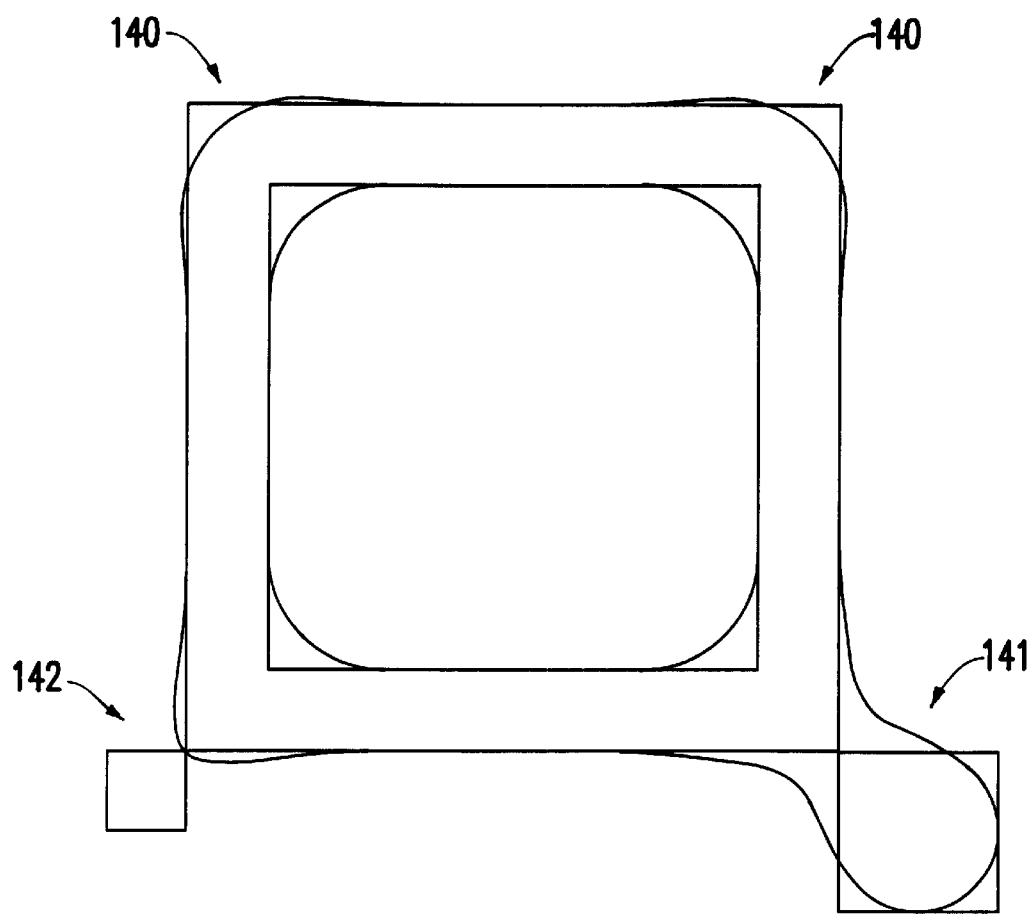
FIG. 14 is a schematic architectural diagram of a mask useful with a square aperture having $r > w$ overlaid with an aerial image/resist pattern.

FIG. 14 presents a typical aerial image/resist pattern. The upper half 140 of the figure shows the corner rounding in the absence of any serifs. The lower-right part 141 of the figure illustrates the aerial image/resist pattern for the original serif mask design shown in FIG. 6; namely, a square serif of size r×r was hanging at the outer corner. The lower-left part 142 of FIG. 14 corresponds to FIG. 13. Here, the aerial image/resist pattern passes through the outer corner of the elbow. Moreover, with a serif of less size (a square 141 of size r×r at the lower-right part versus a square 142 of size w×w at the lower-left part), the serif itself also becomes not printable, as desired.

Figure 15:
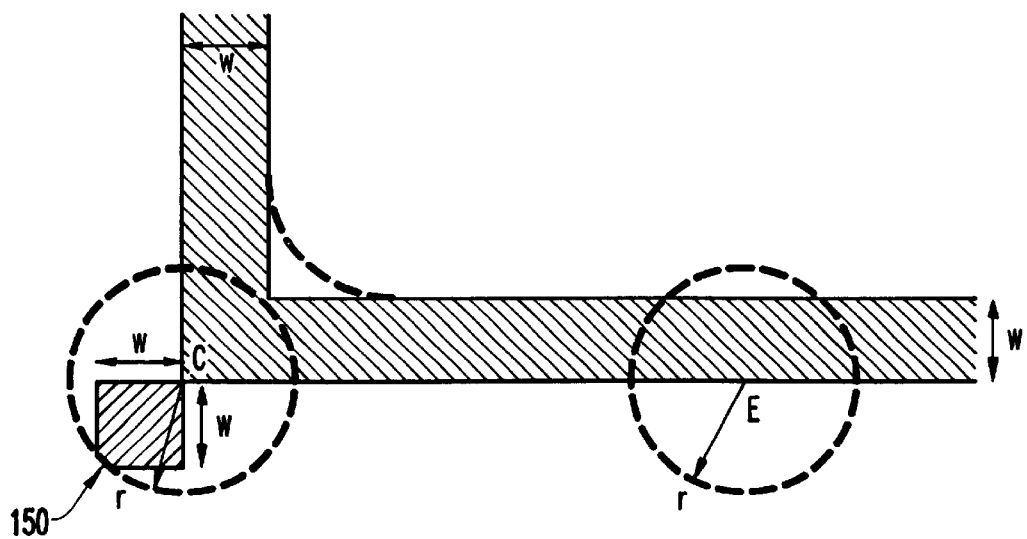
FIG. 15 is a schematic architectural diagram of a mask useful with a circular aperture when $w < r \leq \sqrt{2}n$.

FIG. 15 illustrates the inventive application to circular aperture. The serif design shown in FIG. 13 still gives equal aerial intensity $I_C=I_E$ for circular aperture when r>w. Under certain situations, the serif's shape can be optimized without changing aerial intensity $I_C$ at the outer corner C (i.e., the invention always maintains $I_C=I_E$). FIG. 15 illustrates an ideal serif mask design when w<r<√2w. The serif 150 is the intersection of a square of size w×w (see FIG. 13) with a circle of radius r. The arc edge of the serif 15 (coming from the intersection) can be approximated by one or more straight-line segments. Again, this reduces the serif's area so that serif itself becomes less likely to be printable in aerial image/resist pattern.

Figure 16:
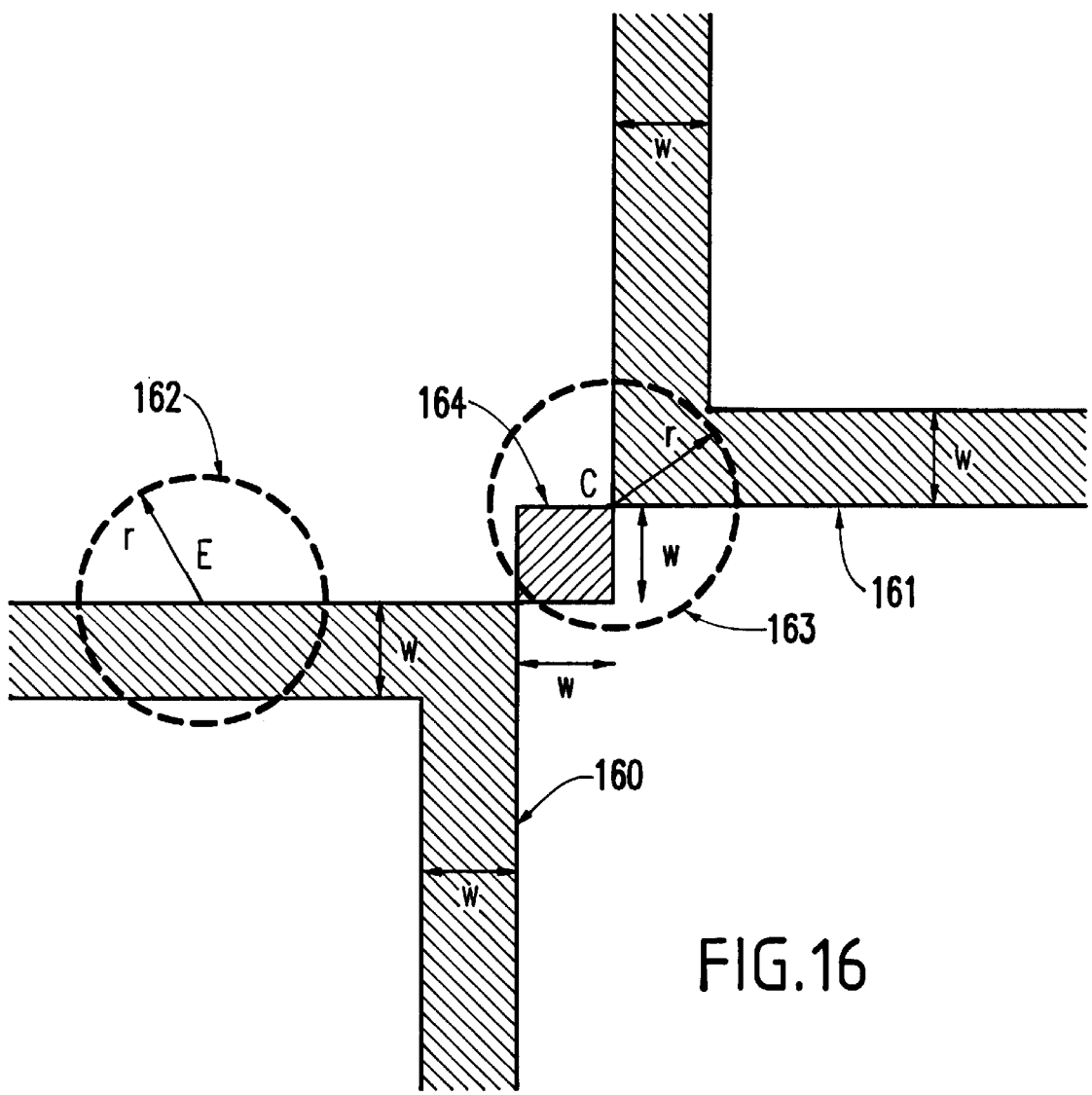
FIG. 16 is a schematic architectural diagram of a mask useful with a circular aperture when $w < r \leq \sqrt{2}n$.
Figure 17:
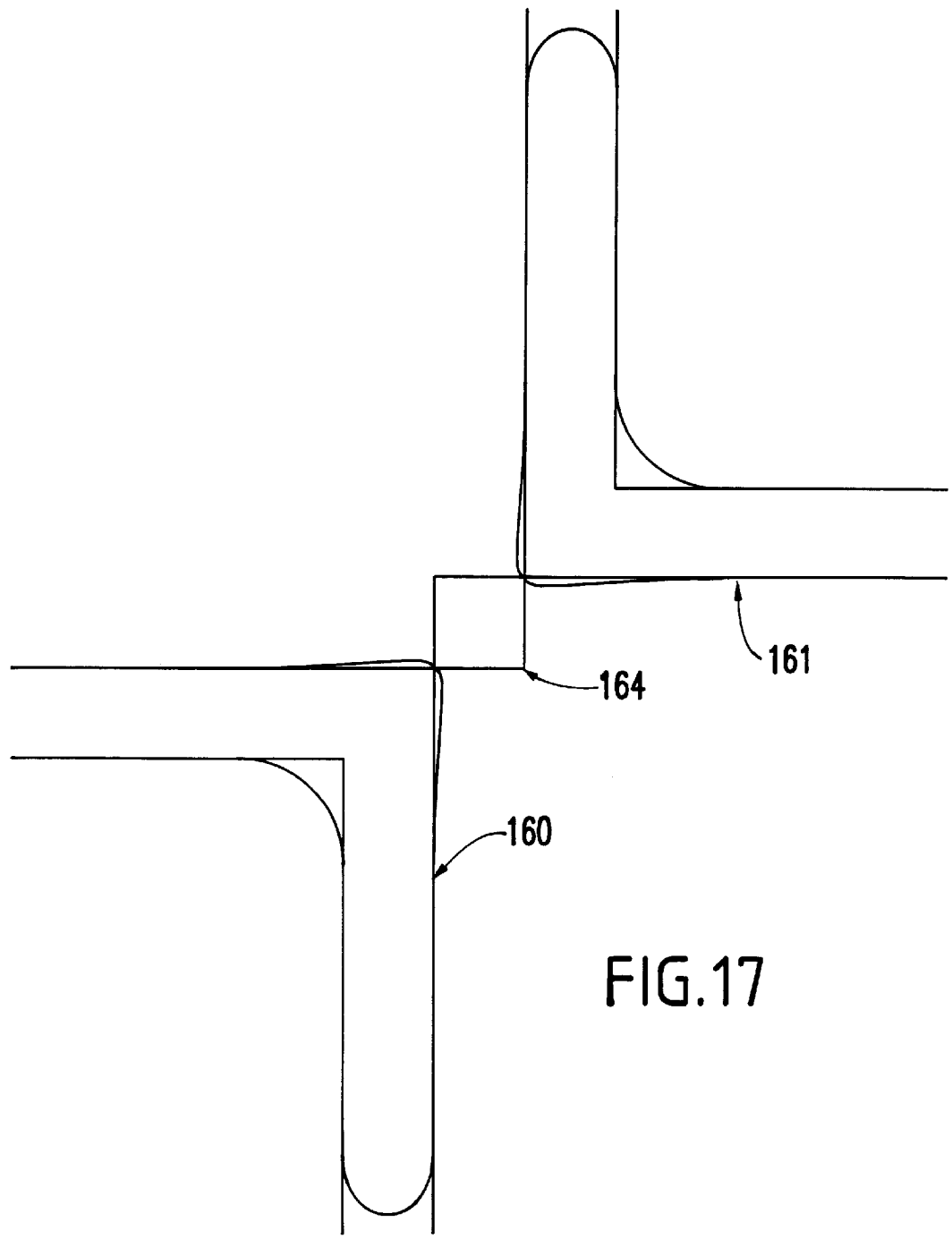
FIG. 17 is a schematic architectural diagram of a mask useful with a circular aperture when $w < r \leq \sqrt{2}$ overlaid with an aerial image/resist pattern.

FIG. 16 shows an example of co-serif mask design between two neighboring elbows 160, 161 for circular aperture with w<r<√2w. Again in this example only the second complementary design rule will produce a serif 164 and the same serif is produced when applied to each elbow 160, 161. In FIG. 16 that $I_C=I_E$ The dash circle 163 would normally cut a portion of the serif 164. However, the elbow 160 needs that part and the portion is not removed. A portion is removed only if it is not required by one of the shapes. The serif symmetrically effects both elbows 160 and 161. The corresponding aerial image/photoresist pattern is displayed in FIG. 17. The aerial image/resist pattern passes through the outer corners of both elbows exactly. At outer corners of elbows, corner rounding is corrected completely (possibly with some over-correction).

Figure 18:
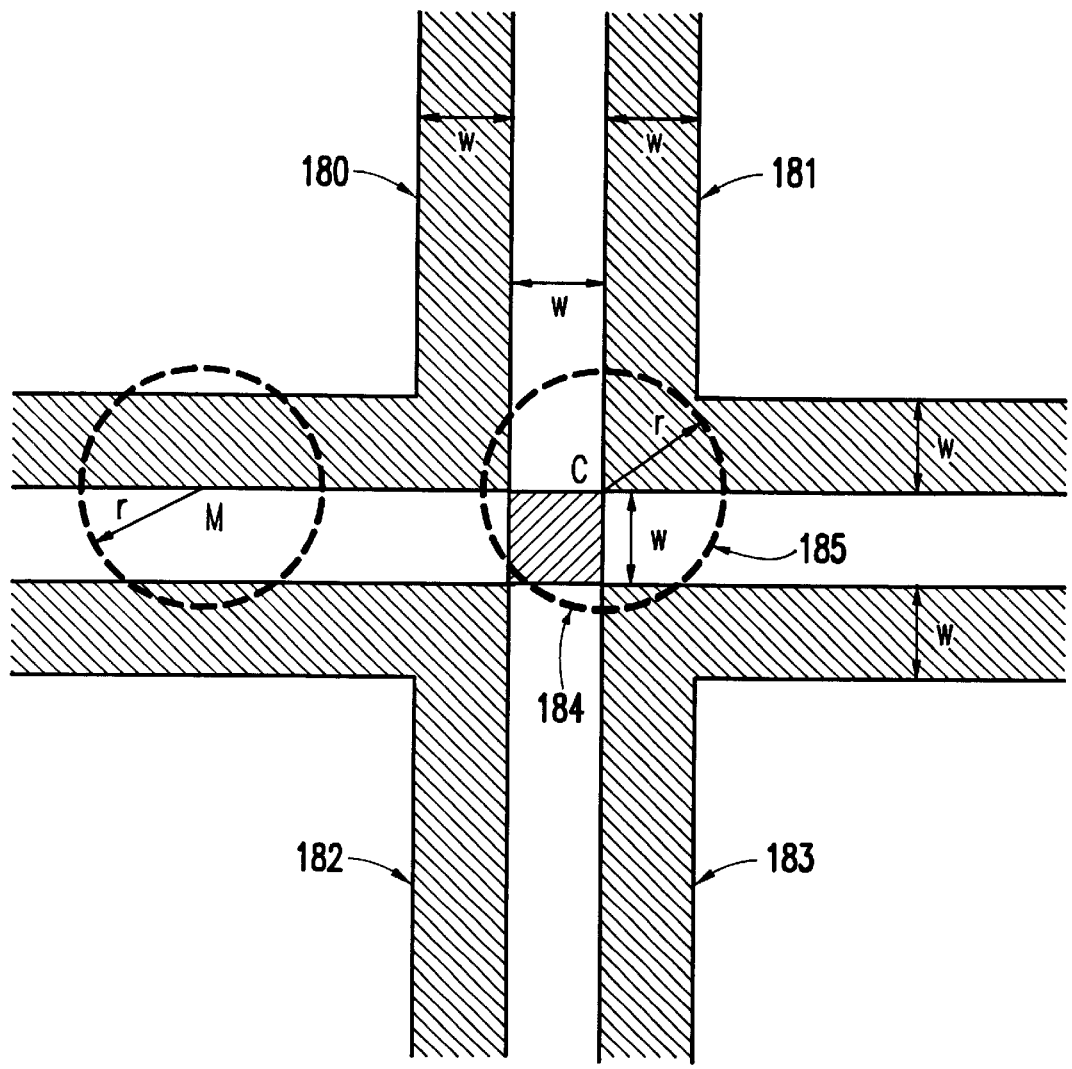
FIG. 18 is a schematic architectural diagram of a mask useful with a circular aperture when $w < r \leq \sqrt{2}n$
Figure 19:
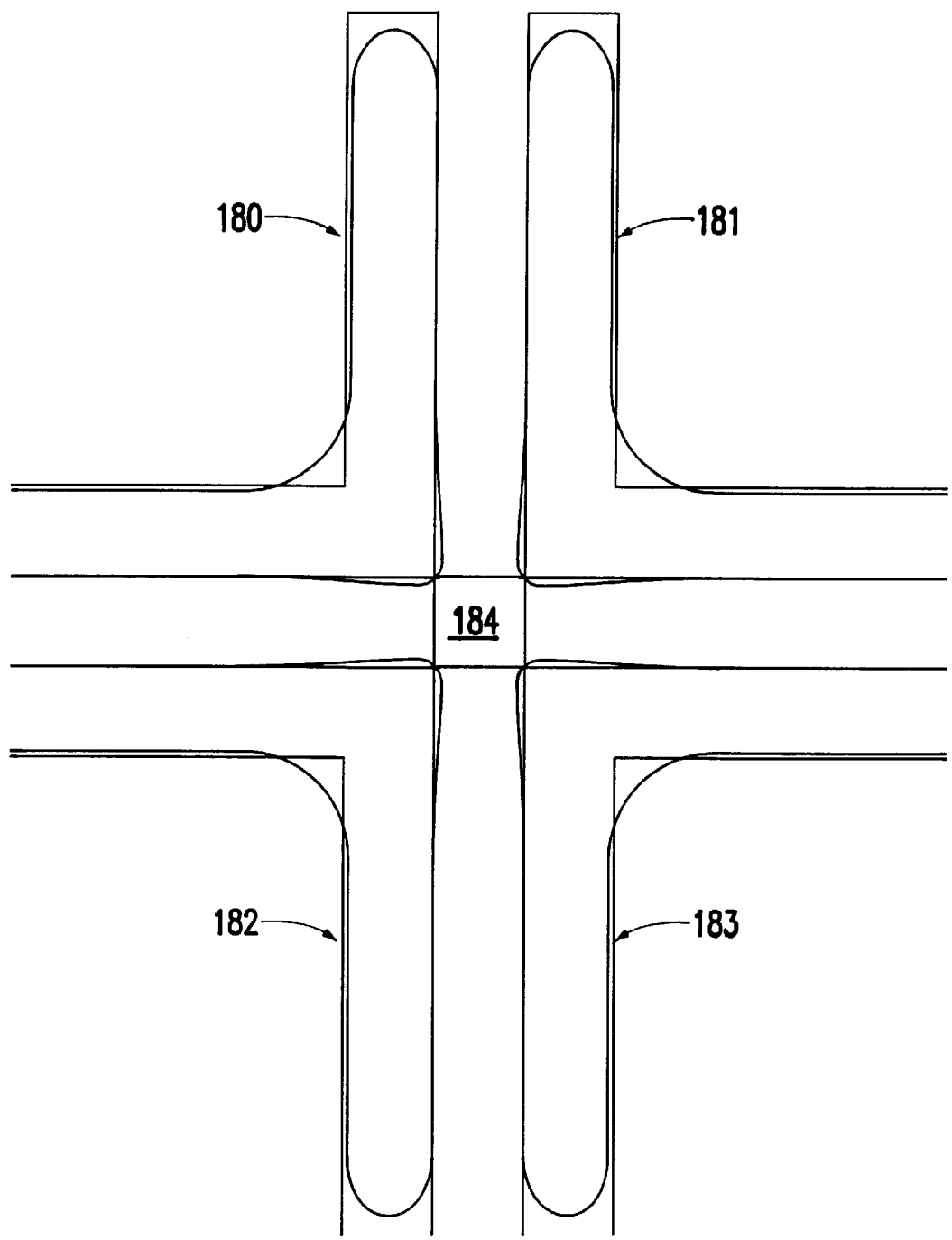
FIG. 19 is a schematic architectural diagram of a mask useful with a circular aperture when $w < r \leq \sqrt{2}n$ overlaid with an aerial image/resist pattern.

FIG. 18 illustrates another co-serif mask design among four elbows 180–183 for circular aperture with w<r<√2w. The width of each line is w, and so is the spacing between them. Again in this example, only the second complementary design rule will produce a serif 184 and the same serif is produced when the second complementary design rule is applied to each elbow 180–183. In FIG. 18 $I_C=I_M$, where M is a point on an outer edge line of an elbow. The dash circle 185 cuts a portion of the serif 184 but other 90 turn needs that part (which would be cut out if there is only one elbow). A part is cut out only if nobody needs it. The serif symmetrically effects all elbows 180–184. FIG. 19 shows the corresponding aerial image/photoresist pattern. The aerial image/resist pattern passes through each of four outer corner points exactly. At outer corners of elbows, corner rounding is corrected completely (possibly with some over-correction).

Figure 20:
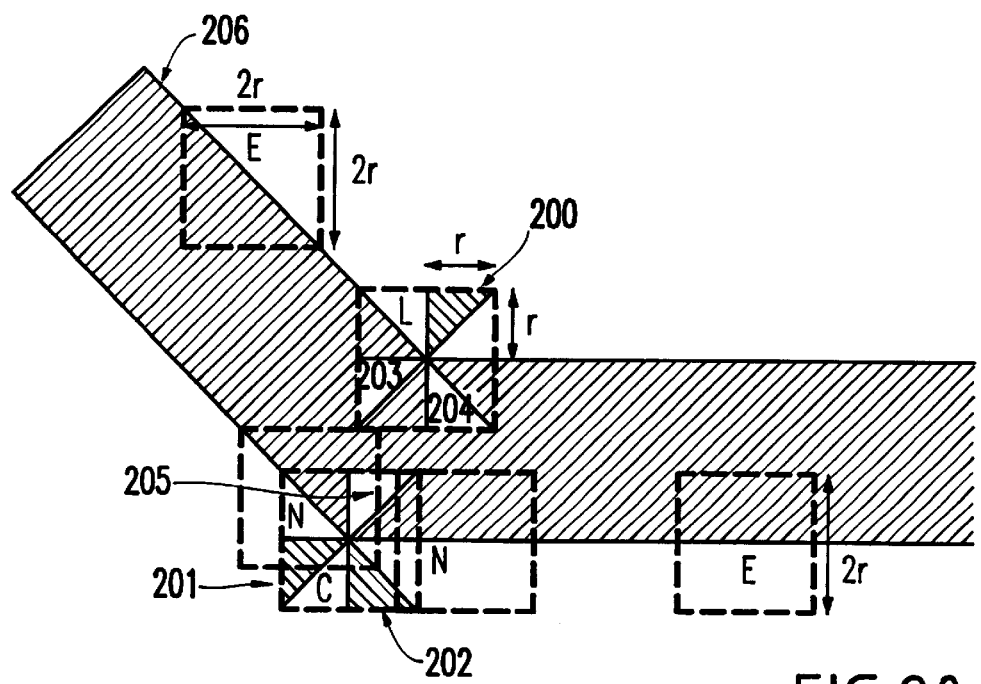
FIG. 20 is a schematic diagram of triangular serifs and holes for a 45-degree-turn mask.

The following discussion applies the same principles to the 45 degree-angle turn shape discussed above with respect to FIGS. 1E–1H. FIG. 20 shows a serif mask design for correcting corner rounding at both inner corner L and outer corner C of a 45-degree turn. In FIG. 20, each of the serifs 200–202 and holes 203–205 is a 45-degree regular triangle of short side length r created using the first and second complementary design rules discussed above. In FIG. 20, again the masked areas (or unmasked areas) within the dashed-line squares are the same. More importantly, total volumes of 3D cone structures within dashed-line squares are equal, independent of the specific shape of kernel function K(x, y). Here, K(x, y) satisfies equation (1) and, again, the invention produces equal aerial intensity (i.e., $I_C=I_L=I_N=I_E$) for both incoherent and coherent light illuminations, independent of the shape of their kernel functions. Once again, the edge point N in FIG. 20 can be anywhere on the outer edges or anywhere on the inner edges.

Thus, the invention corrects corner rounding at both inner and outer corners perfectly for 45 degree angle turn when r≦w/2. Within the dashed-line square centered at either outer corner C or inner corner L, there are 4 opaque regular triangles and 4 clear regular triangles. If one changes each triangle from opaque to clear and vise versa, one still has perfect corner rounding correction.

Figure 21:
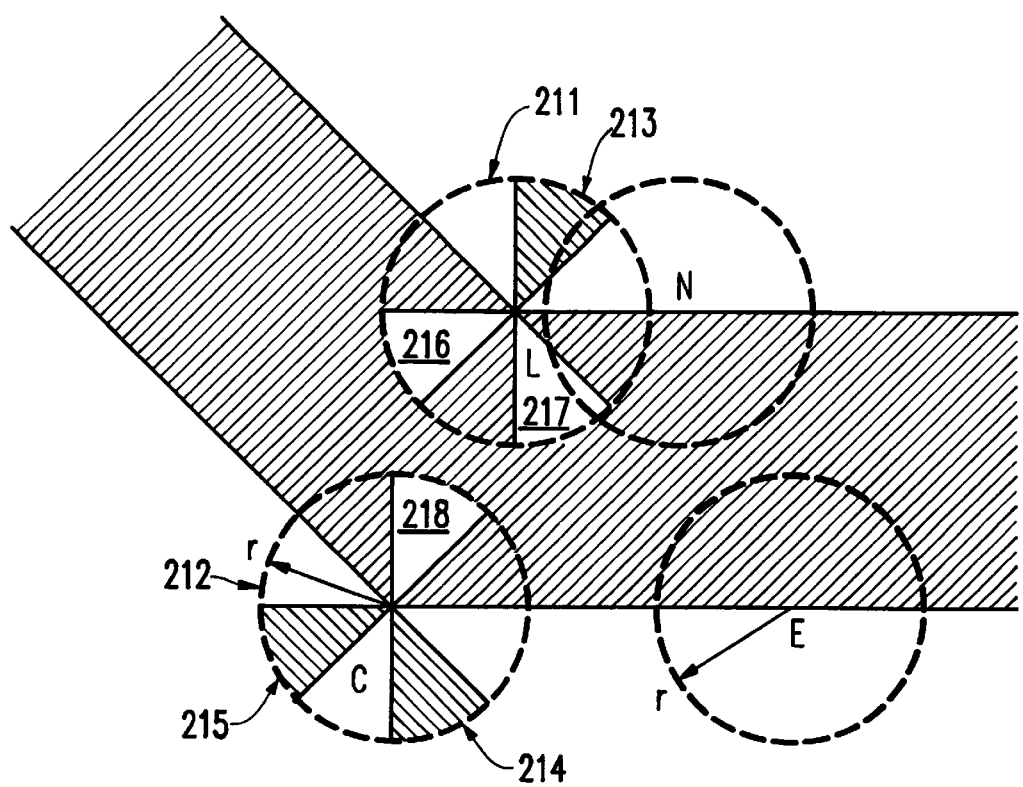
FIG. 21 is a schematic diagram of ⅛-circle serifs and holes for a 45-degree-turn mask.

With reference to FIGS. 20 and 21, the appearance of these triangular serifs 200–202, 213–215 and holes 203–205, 216–218 the first and second complementary design rules can be more broadly restated as "mirroring-and-reverse" serif mask design rules to accommodate for other shapes, such as the 45-degree shape discussed above with respect to FIG. 1E.

In mirror-and-reverse design rule 1, an edge line (e.g., edge 206 in FIG. 20) serves as a mirror axis. In mirror-and-reverse design rule 2, the mirroring-and-reverse region is determined in a similar manner discussed above in the complementary design rules by sliding the center of a square of size 2r×2r (e.g., for square aperture in FIG. 20) or a circle of radius r (e.g., see FIG. 21) along edges to sweep all points within the mirror-and-reverse region. Again, in mirror-and-reverse design rule 3, to correct corner rounding, the invention makes the mask pattern (transparent or opaque) on one side of an axis the reverse of the other side's mirror image. At the corners, as was discussed above, mirror imaging is done for both axes near a corner. Finally, in mirror-and-reverse design rule 4, for either an edge point or a corner point, reverse and mirror images are achieved for each and every point within the 2r×2r square or within a circle of radius r. Therefore, as can be clearly seen, these rules are broader generalizations of the previously discussed first and second complementary design rules.

Applying these mirror-and-reverse rules to the cases involving circular aperture, the kernel function K(r) is assumed to be angle-independent. Consequently, the serif designs 200–202 presented in FIG. 20 still gives equal aerial intensity/resist pattern $I_C=I_L=I_N=I_E$, and thus still gives perfect corner rounding correction at both inner and outer corners for circular aperture. The serif's shape, however, can be reduced without changing any intensities $I_C$, $I_L$, $I_N$ (i.e., always maintains $I_C=I_L=I_N=I_E$). Again, the improvement achieved here for circular aperture is to reduce the sizes of serifs and holes so that they become less likely to be printable in aerial image/resist pattern.

FIG. 21 illustrates serif photomask design using the above rules. After area reduction, a 45-degree regular triangle of short side length r becomes ⅛ of a circle of radius r. The edge point N in FIG. 21 can again be anywhere on the outer edges or anywhere on the inner edges. In other words, serif mask design in FIG. 21 has corrected corner rounding at both inner and outer corners perfectly. Within the dashed-line circles 211, 212 centered at either outer corner C or inner corner L, there are eight 45-degree pie regions inside each circle, four of which are opaque and four of which are clear. Even if the opaque and clear are switched (e.g., each opaque (clear) pie is changed into a clear (opaque) pie), there will still be perfect corner rounding correction with the invention.

The above exchange method can also be applied to the 90-degree structure discussed above, as shown in FIG. 22. In a manner similar to that discussed above, the invention first considers square aperture, for which the kernel function K(x, y) obeys the symmetry properties given in eq. (1), and then considers circular aperture, where the kernel function K(r) is assumed to be angle-independent.

With the invention, portions of the serifs can be exchanged with the shape to make the serif and hole not printable. The purpose of the exchange method is to eliminate the aerial image/resist pattern of larger serifs and holes while maintaining the aerial image/resist pattern at desired wire edges and corners. The specific processes include identifying large serifs and holes around a corner, dividing the area around the corner into 4 quadrants. In the quadrant where the serif or hole resides, the invention reduces the size of a large serif by taking away part of it, or reduces the size of a large hole by filling part of it. In the case of reducing the size of a large serif, the area to be taken away is about ¼ to 4/9 of the original serif size. In other words, the side length of a square to be taken away is about ½ to ⅔ of the side length of the original serif. In the case of reducing the size of a large hole, the size to be filled is about ¼ to 4/9 of the original hole size. Namely, the side length of the region we want to fill within the original hole is about ½ to ⅔ length of the original hole. Then, the invention takes mirroring-and-reversing action with respect to two edge lines of the corner. If this results filling part of a hole in, say, the third quadrant, then the invention forms one small hole in the second quadrant and another small hole of the same size in the fourth quadrant. Finally, the invention applies the mirroring-and-reversing action for the 3rd time and adds another serif in the first quadrant.

The exchange method exchanges two masked small area in the second and fourth quadrants with two unmasked area in the first and third quadrants. The masked and unmasked areas form mirror images of each other with respect to the two edge lines, which are also complementary symmetry lines in the invention.

Figure 22:
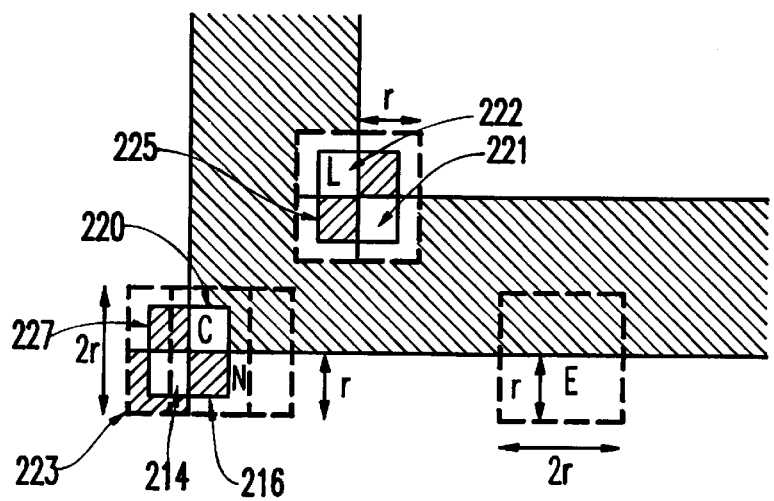
FIG. 22 is a schematic architectural diagram illustrating exchanges within the serifs to prevent the serifs and/or hole from actually being printed.

More specifically, starting from serif mask design in FIG. 2B, part of square serif (hole) is exchanged with nearby unmasked (masked) region 220 and 224 in FIG. 22, and then the new design is rebalanced according to the above serif mask design rules. FIG. 22 shows the result of simple exchanges discussed above at both inner corner L (e.g., 225 and 221, 222) and outer corner C (e.g., 220 and 224). Since the intensity within the serif structure 223 (near outer corner C) is too large, a smaller square 224 is removed from it. Based on the above serif mask design rules, mirror images 226, 227 are created along both horizontal and vertical edges. Similarly, since the intensity within the hole near the inner corner L is too low, the invention makes the hole smaller by adding opaque region 225, and performs "mirroring-and-reverse" operations in the other 3 quadrants near the inner corner L. Finally, within dashed-line bigger squares in FIG. 22, four different truncations still lead to the same total volume of 3D cone structure, and the invention still produces $I_C=I_L=I_N=I_E$ for both incoherent and coherent light illuminations.

Figure 23:
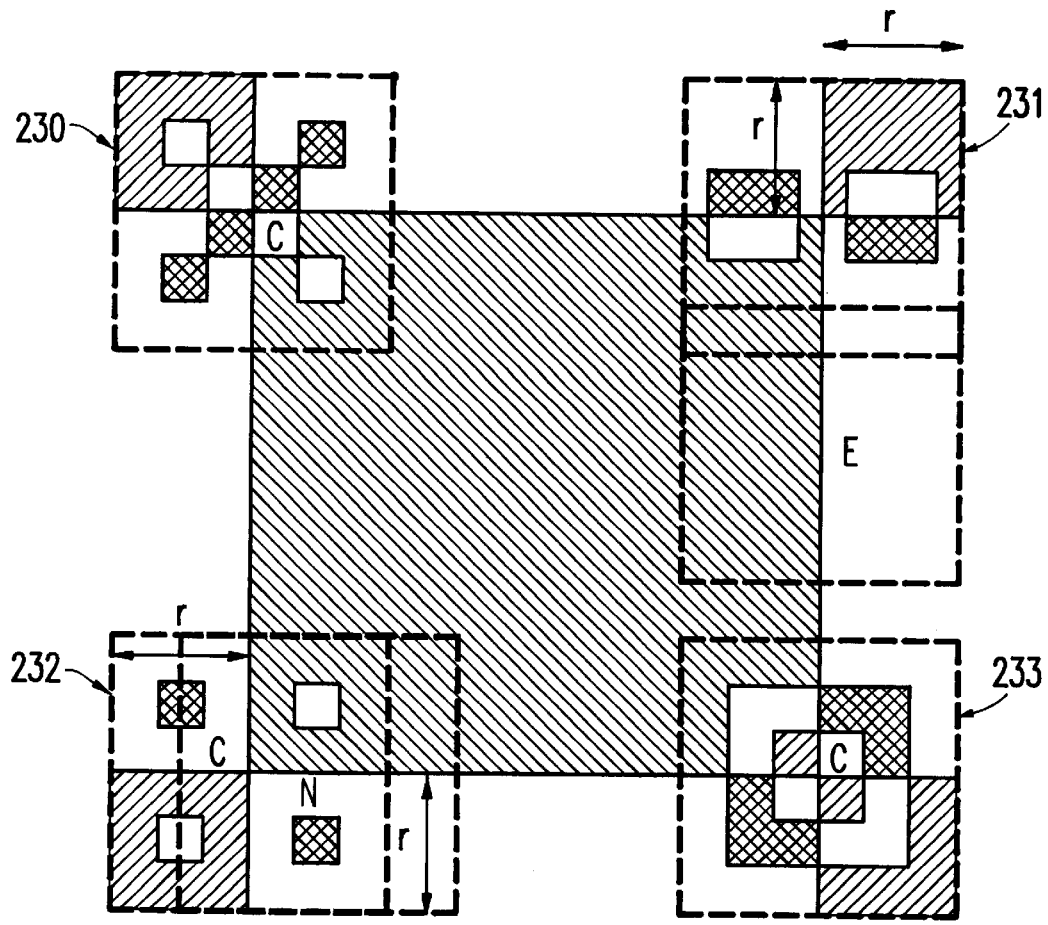
FIG. 23 is another example of a schematic architectural diagram illustrating exchanges within the serifs to prevent the serifs and/or holes from actually being printed.

There exist many serif mask designs to spread the serif/hole areas to other quadrants around a corner. FIG. 23 gives several such examples for outer corners (230–233). Within dashed-line bigger squares in FIG. 23, different truncations still lead to the same total volume of the 3D cone structure and the invention produces $I_C=I_N=I_E$ for both incoherent and coherent light illuminations. As would be known by one ordinarily skilled in the art given this disclosure, the same designs can be used for inner corners. When serifs/holes are no longer printed, the invention achieves the following two aims simultaneously: (a) full correction for corner rounding and (b) preventing printing the serif features that are introduced.

Figure 27:
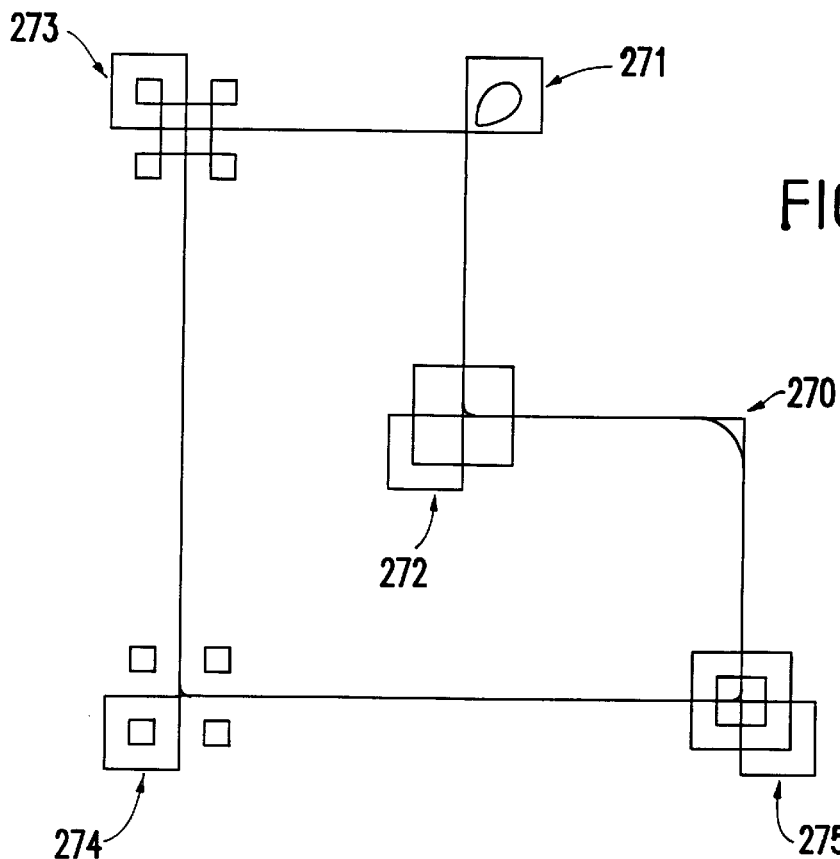
FIG. 27 is a schematic architectural diagram of a mask useful with a circular aperture overlaid with aerial image/resist pattern.

FIG. 27 presents a typical aerial image/resist pattern for various serif designs shown in FIGS. 22 and 23. Corner rounding is apparent in the right-middle corner 270, at which there is not any serif. As a comparison, FIG. 27 also shows the aerial image/resist pattern where the solid serif at the upper-middle corner 271 is indeed printed, as previously illustrated in FIG. 2B. An exchanged hole 272 design in FIG. 22 is shown in the middle of FIG. 27. The hole structure 272 itself is not printed. In FIG. 27, the serif structures used at the upper-left 273, lower-left 274, and lower-right 275 corners correspond to the upper-left, lower-left, and lower-right corners in FIG. 23, respectively. Each of the serif structure disappears, and the invention achieves its objective.

Figure 24:
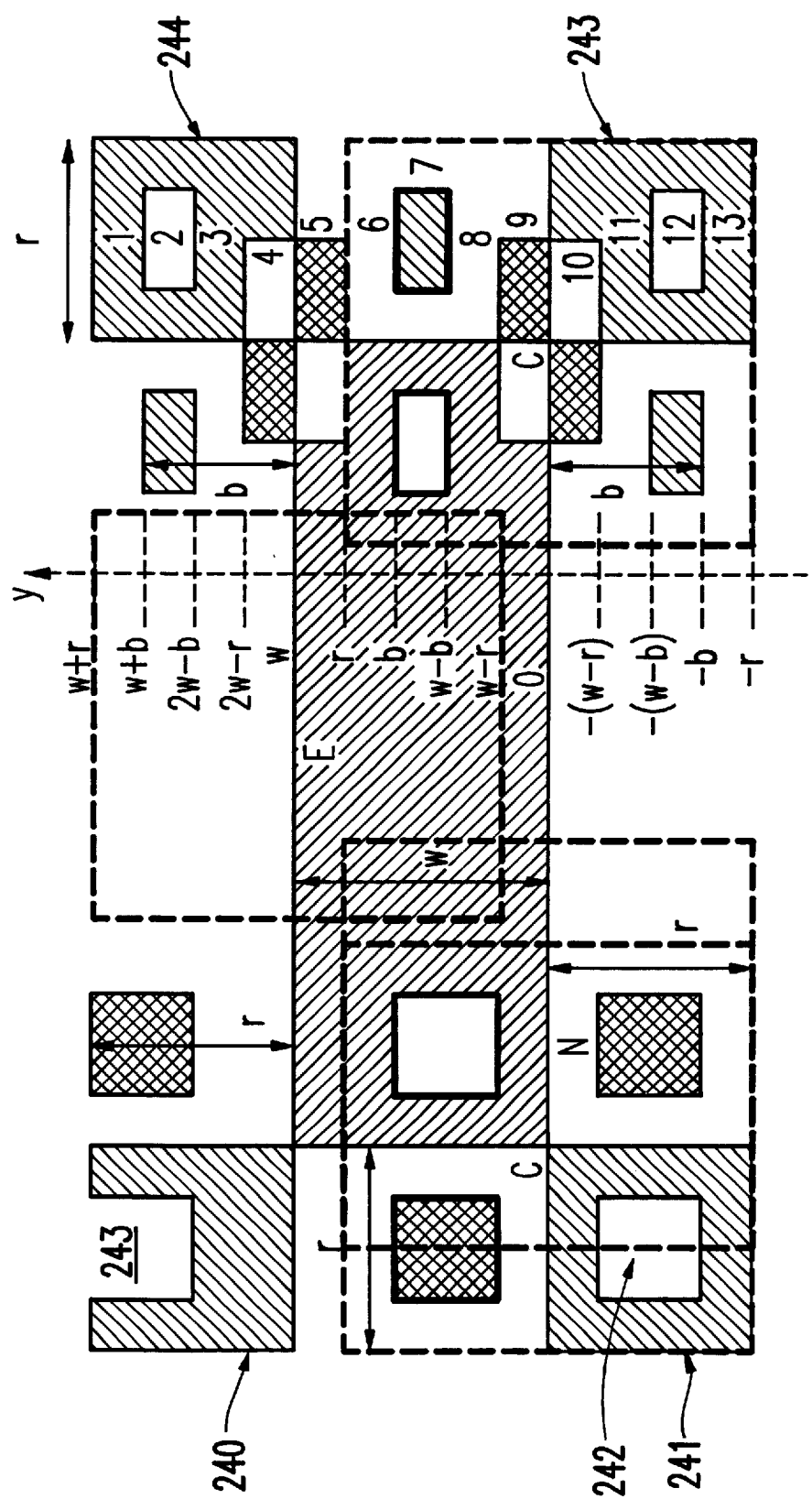
FIG. 24 is a schematic architectural diagram illustrating co-serifs and co-holes for two different corners at each line end.

When r>w/2, the invention makes some of serifs (holes) co-serifs (co-holes) for both corners at one end of a wire. FIG. 24 illustrates such an example, in which highlighted serifs and holes in the middle are co-serifs and co-holes, respectively, for both upper and lower corners. On the left end of the wire, serifs 240, 241 and holes 242, 243 for the upper and lower corners are not symmetric. On the right end of the wire, serifs 244, 245 and holes 2, 12 for the upper and lower corners are symmetric. In both situations, there are additional restrictions on the serif design, since serifs and holes may be coupled.

For purposes of explanation, the discussion will center on the symmetric serifs 244, 245 beyond the right end of the wire. If the invention starts from making segment 1 at the top filled, then segment 13 at the bottom must also be filled (all beyond the original wire's end). In addition, both segments 6 and 8 in the middle must be empty based on the mirroring-and-reverse rules. Moreover, both segments 3 and 11 must be filled. Thus, there is a restriction in that exchanges can only occur in the following 3 segment groups: (i) between segments 4 and 5; (ii) between segments 9 and 10; and (iii) among segments 2, 7, and 12. In this example, the invention performs corrections at both the upper and lower corners. Usually it is more difficult to correct both corners simultaneously. However, as shown in FIG. 24 with multiple passes of the above stated rules, the corrections can be performed such that all the corners are corrected without interfering with one another.

The following discussion concerns the circular-aperture cases. Each of serif designs presented above in FIGS. 22–24, produce equal aerial intensity $I_C=I_L=I_N=I_E$ and thus perfect corner rounding correction (even for circular-aperture cases). The serif's shape, however, can be reduced in size without changing any intensities $I_C$, $I_L$, and $I_N$, (i.e., the invention always maintains $I_C=I_L=I_N=I_E$). Again, the invention reduces the sizes of serifs and holes so that they become less likely to be printable in aerial image/resist pattern. With the invention any part of serif that lies outside the circle which centers at the corner and has a radius r can be safely cut out. Similarly, any part of a hole that lies outside the circle which centers at the corner and has a radius r can be safely filled.

Figure 25:
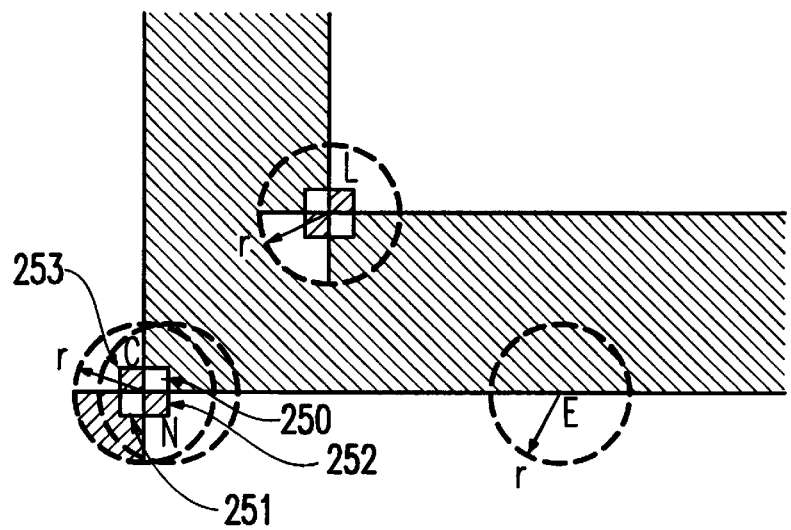
FIG. 25 is a schematic architectural diagram illustrating exchanges within a mask to make quarter-circle serifs and holes not printable.

The invention also directly improves an original quarter-circle serif and hole design to make serif/hole structure disappear in the aerial image/resist pattern by the method of exchange, discussed above. Starting from serif mask design in FIG. 3B, the invention makes simple exchanges: switching two filled squares 250, 251 in the first and third quadrants with two empty squares 252, 253 in the second and fourth quadrants. The new serif mask design after exchanges is shown in FIG. 25. Within four dashed-line full circles in FIG. 25, different cuts still give the same total volume of 3D cone structure and the invention maintains $I_C=I_L=I_N=I_E$ for both incoherent and coherent light illuminations.

Figure 26:
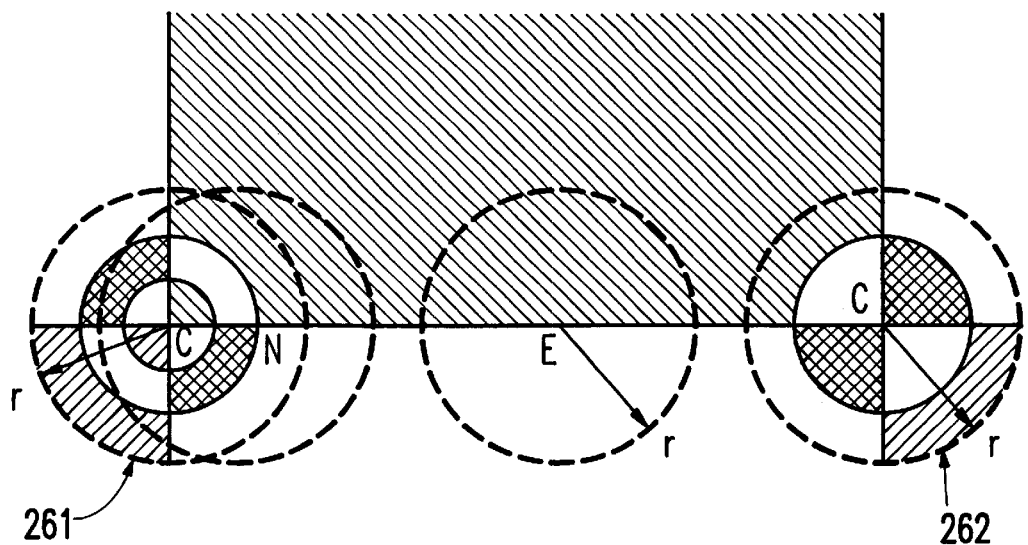
FIG. 26 is a schematic architectural diagram illustrating ¼-circle serifs and holes after various exchanges.

Again, there are many serif mask designs to spread the serif/hole areas to other quadrants around a corner. FIG. 26 shows two such examples for outer corners. Within dashed-line full circles in FIG. 26, different cuts still give the same total volume of 3D cone structure, and the invention maintains $I_C=I_N=I_E$ for both incoherent and coherent light illuminations. As would be known by one ordinarily skilled in the art given this disclosure, the same designs can be used for inner corners.

Figure 28:
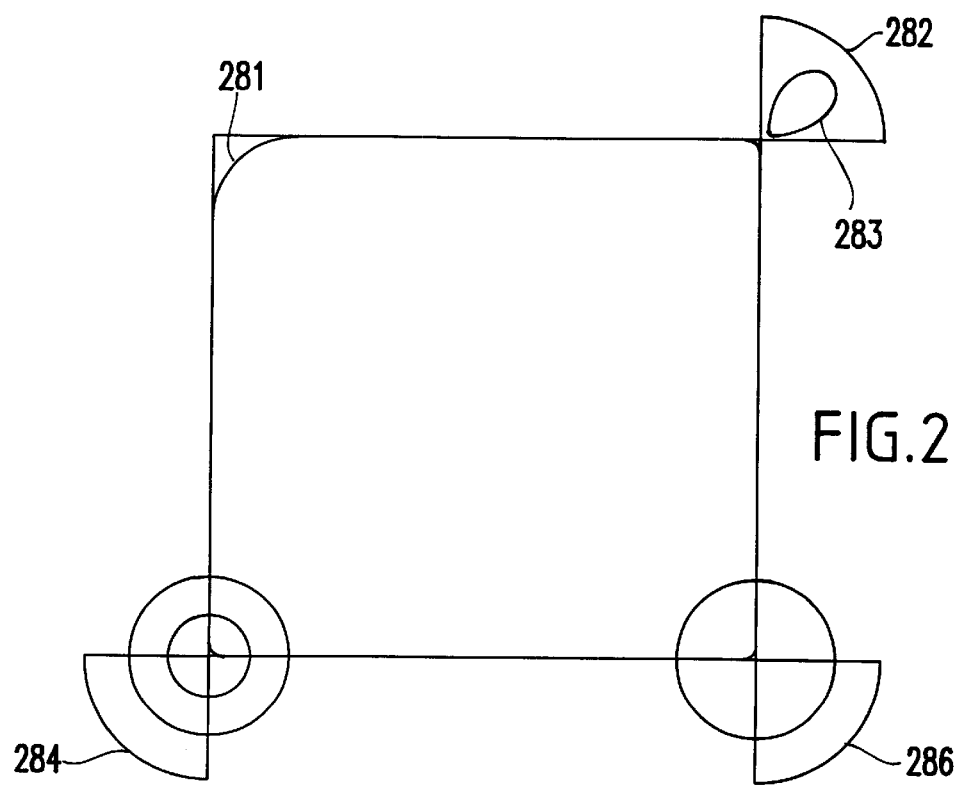
FIG. 28 is a schematic architectural diagram of a mask useful with a circular aperture overlaid with aerial image/resist pattern.

FIG. 28 is a typical aerial image/resist pattern for mask designs in FIG. 26. Corner rounding is apparent in the upper-left corner 281, where there is no serif. In contrast, FIG. 28 also shows the aerial image/resist pattern from the mask shown in FIG. 3B. The solid quarter-circle serif 282 at the upper-right corner 283 is printed, and this corresponds to the situation shown in FIG. 3B. In FIG. 28, the serif structures used at the lower-left 284 and lower-right 286 corners correspond to the lower-left 261 and lower-right corners 262 in FIG. 26, respectively. Each of the serif structures disappear, and the invention's goal is accomplished. It would be known to one ordinarily skilled in the art, once given this disclosure that many other serif mask designs can be easily constructed based on the inventive exchange and serif mask design rules.

The invention corrects corner rounding and line end foreshortening even when optical proximity effects are severe. At the same time, various serifs and holes used to perform optical proximity correction will not appear in the aerial image or resist pattern, with the invention. For a given light wavelength used in lithography, the invention can form integrated circuit printed patterns having even smaller feature sizes than conventional systems and methods.

While the invention has been described in terms of preferred embodiments, those skilled in the art will recognize that the invention can be practiced with modification within the spirit and scope of the appended claims.

What is claimed is:

1. A method of performing optical proximity correction in a photolithographic mask to prevent corner rounding and line end foreshortening, said method comprising:
    identifying a complementary symmetry line along an edge of a shape within said photolithographic mask, said complementary symmetry line intersecting a corner of said shape;
    defining a complementary region within said shape adjacent said complementary symmetry line;
    changing a transparency of said photolithographic mask to form a negative complementary image of said complementary region external to said shape adjacent said complementary symmetry line;
    identifying quadrants around said corner of said shape; and
    changing a transparency of said quadrants to form mirror images between diagonal quadrants.

2. The method in claim 1, wherein said shape includes an internal mask region adjacent said corner having a size r and said complementary region has a width from said complementary symmetry line equal to r, wherein r is equal to a resolution limit of a light source used in lithography.

3. The method in claim 1, wherein said shape includes an internal mask region adjacent said corner having a size min (r, w) and said quadrants comprise min (r, w)×min (r, w) squares,
    wherein r is equal to a resolution limit of a light source, w is equal to a wire width, and min (r, w) is a minimum of r and w.

4. The method in claim 1, wherein said shape comprises an elbow having an inner corner and an outer corner, said inner corner including an internal mask region corresponding to an external non-mask region adjacent said outer corner,
    said method further comprising, before said identifying of said complementary symmetry line, complementarily exchanging a transparency of said internal mask region and said external non-mask region.

5. The method in claim 1, wherein said shape comprises an elbow having an inner corner and an outer corner, said inner corner including an internal mask region corresponding to an external non-mask region adjacent said outer corner, and
    wherein said internal mask region and said external non-mask region comprise one of a square region and a circular region.

6. The method in claim 1, further comprising changing a transparency of a portion of said quadrants to form said mirror images.

7. The method in claim 1, wherein said shape comprises one of a 90-degree corner and a 45-degree corner.

8. A method of performing optical proximity correction in a photolithographic mask to prevent rounding of corners of a shape on said photolithographic mask, said method comprising:
    changing a transparency of said photolithographic mask along each edge of said shape intersecting a corner of said shape to establish complementary symmetry along each edge of said shape; and
    changing a transparency of quadrants around each corner of said shape to form mirror image diagonal quadrants centered on corners of said shape.

9. The method in claim 8, further comprising:
    identifying a complementary symmetry line along an edge of a shape within said photolithographic mask, said complementary symmetry line intersecting a corner of said shape; and
    defining a complementary region within said shape adjacent said complementary symmetry line,
    wherein said changing comprises changing a transparency of said photolithographic mask to form a negative complementary image of said complementary region external to said shape adjacent said complementary symmetry line.

10. The method in claim 9, wherein said shape includes an internal mask region adjacent said corner having a size r and said complementary region has a width from said complementary symmetry line equal to r, wherein r is equal to a resolution limit of a light source.

11. The method in claim 9, wherein said shape comprises an elbow having an inner corner and an outer corner, said inner corner including an internal mask region corresponding to an external non-mask region adjacent said outer corner,
    said method further comprising, before said identifying of said complementary symmetry line, complementarily exchanging a transparency of said internal mask region and said external non-mask region.

12. The method in claim 8, wherein said shape includes an internal mask region adjacent said corner having a size min (r, w) and said quadrants comprise min (r, w)×min (r, w) squares, wherein r is equal to a resolution limit of a light source, w is equal to a wire width, and min (r, w) is a minimum of r and w.

13. The method in claim 8, wherein said shape comprises an elbow having an inner corner and an outer corner, said inner corner including an internal mask region corresponding to an external non-mask region adjacent said outer corner, and wherein said internal mask region and said external non-mask region comprise one of a square region and a circular region.

14. The method in claim 8, further comprising changing a transparency of a portion of said quadrants to form said mirror images.

15. The method in claim 8, wherein said shape comprises one of a 90-degree corner and a 45-degree corner.

16. A method of performing optical proximity correction in a photolithographic mask to prevent rounding of corners of a shape on said photolithographic mask, said method comprising:

changing a transparency of said photolithographic mask along each edge of said shape intersecting a corner of said shape to establish complementary symmetry along each edge of said shape.

17. The method in claim 16, further comprising changing a transparency of quadrants around each corner of said shape to form mirror image diagonal quadrants centered on corners of said shape.

18. The method in claim 17, wherein said shape includes an internal mask region adjacent said corner having a size min (r, w) and said quadrants comprise min (r, w)×min (r, w) squares, wherein r is equal to a resolution limit of a light source, w is equal to a wire width, and min (r, w) is a minimum of r and w.

19. The method in claim 17, wherein said shape comprises an elbow having an inner corner and an outer corner, said inner corner including an internal mask region corresponding to an external non-mask region adjacent said outer corner, and wherein said internal mask region and said external non-mask region comprise one of a square region and a circular region.

20. The method in claim 17, wherein said shape comprises one of a 90-degree corner and a 45-degree corner.

21. The method in claim 16, further comprising:

identifying a complementary symmetry line along an edge of a shape within said photolithographic mask, said complementary symmetry line intersecting a corner of said shape; and defining a complementary region within said shape adjacent said complementary symmetry line, wherein said changing comprises changing a transparency of said photolithographic mask to form a negative complementary image of said complementary region external to said shape adjacent said complementary symmetry line.

22. The method in claim 21, wherein said shape includes an internal mask region adjacent said corner having a size r and said complementary region has a width from said complementary symmetry line equal to r, wherein r is equal to a resolution limit of a light source.

23. The method in claim 21, wherein said shape comprises an elbow having an inner corner and an outer corner, said inner corner including an internal mask region corresponding to an external non-mask region adjacent said outer corner, said method further comprising, before said identifying of said complementary symmetry line, complementarily exchanging a transparency of said internal mask region and said external non-mask region.

24. The method in claim 21, further comprising changing a transparency of a portion of said quadrants to form said mirror images.

\* \* \* \* \*